(12) United States Patent
Takada et al.

(10) Patent No.: US 11,996,382 B2
(45) Date of Patent: May 28, 2024

(54) PALLADIUM-COATED COPPER BONDING WIRE, MANUFACTURING METHOD OF PALLADIUM-COATED COPPER BONDING WIRE, SEMICONDUCTOR DEVICE USING THE SAME, AND MANUFACTURING METHOD THEREOF

(71) Applicant: TANAKA DENSHI KOGYO K. K., Saga (JP)

(72) Inventors: Mitsuo Takada, Saga (JP); Nanako Maeda, Saga (JP); Osamu Matsuzawa, Saga (JP); Ryo Ishikawa, Saga (JP); Takuya Kobayashi, Saga (JP)

(73) Assignee: TANAKA DENSHI KOGYO K. K., Kanzaki-gun (JP)

( * ) Notice: Subject to any disclaimer, the term of this patent is extended or adjusted under 35 U.S.C. 154(b) by 431 days.

(21) Appl. No.: 17/537,719

(22) Filed: Nov. 30, 2021

(65) Prior Publication Data

US 2022/0122937 A1 Apr. 21, 2022

Related U.S. Application Data

(63) Continuation of application No. PCT/JP2020/010118, filed on Mar. 9, 2020.

(30) Foreign Application Priority Data

Jun. 4, 2019 (JP) .................................. 2019-104652

(51) Int. Cl.
*H01L 23/00* (2006.01)
*C22C 9/00* (2006.01)
*C22F 1/08* (2006.01)
*H01L 23/498* (2006.01)

(52) U.S. Cl.
CPC ............... *H01L 24/45* (2013.01); *C22C 9/00* (2013.01); *C22F 1/08* (2013.01); *H01L 24/43* (2013.01);
(Continued)

(58) Field of Classification Search
CPC ....................................................... H01L 24/45
(Continued)

(56) References Cited

U.S. PATENT DOCUMENTS

2004/0014266 A1* 1/2004 Uno .................... H01L 24/43
257/E23.025
2017/0117244 A1* 4/2017 Yamada ................. C23C 18/42
(Continued)

FOREIGN PATENT DOCUMENTS

CN 105981164 A 9/2016
CN 106415830 A 2/2017
(Continued)

OTHER PUBLICATIONS

Decision to Refuse in Chinese Application No. 202080032952.5, mailed Feb. 21, 2023, 14 pages.
(Continued)

*Primary Examiner* — Ajay Arora
(74) *Attorney, Agent, or Firm* — ORRICK, HERRINGTON & SUTCLIFFE LLP; K. Patrick Herman; Richard Martinelli

(57) ABSTRACT

A palladium-coated copper bonding wire includes: a core material containing copper as a main component; and a palladium layer on the core material, in which a concentration of palladium relative to the entire wire is 1.0 mass % or more and 4.0 mass % or less, and a work hardening coefficient in an amount of change of an elongation rate 2% or more and a maximum elongation rate ε max % or less of the wire, is 0.20 or less.

15 Claims, 4 Drawing Sheets

[SS CURVE]

(52) U.S. Cl.
CPC .............. *H01L 24/48* (2013.01); *H01L 24/85* (2013.01); *C22C 2204/00* (2013.01); *H01L 23/49805* (2013.01); *H01L 23/49816* (2013.01); *H01L 2224/4321* (2013.01); *H01L 2224/43825* (2013.01); *H01L 2224/43848* (2013.01); *H01L 2224/45147* (2013.01); *H01L 2224/45572* (2013.01); *H01L 2224/45644* (2013.01); *H01L 2224/45664* (2013.01); *H01L 2224/48011* (2013.01); *H01L 2224/48245* (2013.01); *H01L 2224/48453* (2013.01); *H01L 2224/48465* (2013.01); *H01L 2224/85045* (2013.01); *H01L 2924/3512* (2013.01)

(58) Field of Classification Search
USPC .......................................................... 257/677
See application file for complete search history.

(56) References Cited

U.S. PATENT DOCUMENTS

| | | | |
|---|---|---|---|
| 2017/0125135 A1 | 5/2017 | Amano et al. | |
| 2017/0179064 A1 | 6/2017 | Yamada et al. | |
| 2017/0200689 A1 | 7/2017 | Yamada et al. | |
| 2017/0323864 A1 | 11/2017 | Oda et al. | |
| 2021/0280553 A1 | 9/2021 | Amano et al. | |

FOREIGN PATENT DOCUMENTS

| | | | |
|---|---|---|---|
| CN | 107039295 A | 8/2017 | |
| CN | 107041160 A | 8/2017 | |
| EP | 3147938 A1 | 3/2017 | |
| JP | H02-090639 A | 3/1990 | |
| JP | 2009-140953 A | 6/2009 | |
| JP | 2011-124611 A | 6/2011 | |
| JP | 2017-005240 A | 1/2017 | |
| JP | 6487108 B1 | 3/2019 | |
| JP | 6507329 B1 | 4/2019 | |

OTHER PUBLICATIONS

International Search Report for PCT/JP2020/010118, Apr. 14, 2020.
Office Action of Chinese application No. 202080032952.5, Mar. 17, 2022.
Office Action of Chinese application No. 202080032952.5, Sep. 13, 2022.

* cited by examiner

SIDE VIEW

PLAN VIEW

[SS CURVE]

WORK HARDENING COEFFICIENT
(INCLINATION OF APPROXIMATE EXPRESSION:
2% to MAXIMUM ELONGATION RATE)

PALLADIUM-COATED COPPER BONDING WIRE, MANUFACTURING METHOD OF PALLADIUM-COATED COPPER BONDING WIRE, SEMICONDUCTOR DEVICE USING THE SAME, AND MANUFACTURING METHOD THEREOF

CROSS-REFERENCE TO RELATED APPLICATION

This application is a continuation of prior International Application No. PCT/JP2020/010118, filed on Mar. 9, 2020 which is based upon and claims the benefit of priority from Japanese Patent Application No. 2019-104652, filed on Jun. 4, 2019; the entire contents of all of which are incorporated herein by reference.

FIELD

The present invention relates to a palladium-coated copper bonding wire suitable for ball bonding of an electrode of a semiconductor element and an external electrode, a manufacturing method thereof, a semiconductor device using the same, and a manufacturing method thereof.

BACKGROUND

In general, an electrode of a semiconductor element and an external electrode on a circuit wiring board for semiconductors are connected by wire bonding. In this wire bonding, the electrode of the semiconductor element and one end of a bonding wire are bonded by a method called ball bonding (first bonding), and the other end of the bonding wire and the external electrode are bonded by a method called wedge bonding (second bonding). In the ball bonding, a molten ball is formed at a tip of the bonding wire, and the bonding wire is connected to a surface of an aluminum electrode on the semiconductor element via the molten ball, for example.

When forming the molten ball, the tip of the bonding wire is first held vertically, an arc discharge is formed between the tip of the wire and a discharge torch using the Electronic Flame-Off (EFO) method, and by a discharge current thereof, heat input is applied to the tip of the wire. By this heat input, the tip of the bonding wire is heated to melt. A molten metal rises through the wire due to its surface tension, and a spherical molten ball is formed at the tip of the wire to solidify, and thereby a free air ball (FAB) is formed. Subsequently, the free air ball is crimped onto the electrode with ultrasonic waves being applied thereto while heating the electrode of the semiconductor element to about 140 to 300° C., and thereby one end of the bonding wire is bonded onto the aluminum electrode.

A gold wire with a diameter of about 10 to 30 µm has been used for the wire bonding, but due to gold being very expensive, a copper wire has been used in a replaceable portion partly. However, the copper wire has a problem of being oxidized easily, so that a palladium-coated copper wire with a palladium-coated surface has come to be used to solve the oxidation problem.

Although the palladium-coated copper wire suffers from the problem of oxidation of wires or free air balls inherent in copper itself, as well as the problem of improving the properties that tend to be impaired by coating, copper is less expensive than gold and thus has rapidly become popular for use under relatively moderate conditions in consumer devices such as personal computers, peripheral devices thereof, and communication devices, and so on. Furthermore, in recent years, improvements of the palladium-coated copper wire have been in progress, and a shift of bonding wires, which are used under severe conditions, such as in devices for automobile use, to the palladium-coated copper wire has been in progress as well.

For this reason, the palladium-coated copper wire is required to be able to withstand extremely severe and rapidly changing conditions to be suitable for the devices for automobile use. Concretely, the palladium-coated copper wire is required to withstand a wide range of natural environments and their changes, from high-temperature and high-humidity regions such as the tropics and deserts to cold regions, and from mountainous regions to coastal regions, as well as to withstand shocks and vibrations caused by road and traffic conditions. In addition, in recent years, the application to semiconductor products to be installed in aircraft as well as in an engine compartment of automobiles has come under consideration. For this reason, there is a need for the palladium-coated copper bonding wire that meets the requirements of higher levels of bonding reliability than ever before, which can withstand the use under relatively moderate conditions of consumer applications as well as severe conditions.

In the process of developing the palladium-coated copper wire that meets such requirements for high reliability, attempts have been made to improve the bondability of the coated copper wire by adjusting a 0.2% proof stress, a maximum proof stress, and an elongation value per unit cross to fall within predetermined ranges. Further, there is also proposed a palladium-coated copper wire in which, for the purpose of improving bonding reliability of a ball bonding portion under a high-temperature environment of 170° C. or more, predetermined amounts of elements such as Ni, Zn, Rh, In, Ir, and Pt are contained in the wire, to thereby adjust a proof stress ratio represented by maximum proof stress/0.2% proof stress.

SUMMARY OF THE INVENTION

High-integration and high-density of semiconductor elements have been progressed significantly in recent years, and in accordance with this, requirements for wire bonding regarding narrowing of pitch, thinning of wire, increase in the number of pins, increase in the length of wire, and so on, has become strict. Among the above, the narrowing of pitch has been rapidly accelerated, and in the current mass-production level, a 60 µm pitch is realized, and development of a 50 µm pitch is in progress. Furthermore, practical application of extremely-narrow pitch of 45 µm, 40 µm, or the like, is being expected.

Among semiconductor packages such as QFP (Quad Flat Packaging), BGA (Ball Grid Array), and QFN (Quad For Non-Lead Packaging), in BGA, for example, a lot of wires have been bonded to one IC (Integrated Circuit) conventionally. In accordance with the narrowing of pitch of wire bonding, there are manufactured products of QFP and QFN in which 500 wires or more are bonded to one IC. When the number of wires to be bonded to one IC is increased as described above, there is a high risk of contact between adjacent wires, which has been a problem.

The problems regarding the contact are roughly classified into a problem of contact between wires which are adjacent in a lateral direction, and a problem of contact between wires which are adjacent in a height direction. As the problem of contact between adjacent wires as described above, there is a leaning phenomenon in which an upright portion of wire in the vicinity of ball bonding leans, resulting in a narrowed interval between adjacent wires. In the narrow-pitch bonding as described above, further improvement of leaning resistance is required in order to avoid the contact between adjacent wires.

The present invention has been made in order to solve the above-described problems, and an object thereof is to provide a palladium-coated copper bonding wire capable of improving leaning resistance and stably maintaining bonding reliability of ball bonding even in high-temperature and high-humidity environments, and a manufacturing method thereof. Note that the "leaning resistance" means a property of suppressing leaning. Further, an object of the present invention is to provide a semiconductor device capable of improving leaning resistance and stably maintaining bonding reliability even in high-temperature and high-humidity environments, particularly a semiconductor device suitable for packages of QFP (Quad Flat Packaging), BGA (Ball Grid Array), and QFN (Quad For Non-Lead Packaging) and capable of being used for automotive application, and a manufacturing method thereof.

A palladium-coated copper bonding wire of the present invention is a palladium-coated copper bonding wire including: a core material containing copper as a main component; and a palladium layer on the core material, in which a concentration of palladium relative to the entire wire is 1.0 mass % or more and 4.0 mass % or less, and a work hardening coefficient in an amount of change of an elongation rate of 2% or more and a maximum elongation rate of ε max % or less of the wire, is 0.20 or less.

It is preferable that the palladium-coated copper bonding wire of the present invention contains at least one of sulfur group elements, and a total concentration of the sulfur group elements relative to the entire wire is 50 mass ppm or less in terms of concentration as a result of removing a concentration of a sulfur group element derived from the core material containing copper as the main component.

It is preferable that the palladium-coated copper bonding wire of the present invention contains at least one of sulfur group elements, and as a concentration obtained by removing a concentration of a sulfur group element derived from the core material containing copper as the main component from a concentration of the sulfur group elements relative to the entire wire, a concentration of sulfur is 5.0 mass ppm or more and 12.0 mass ppm or less, a concentration of selenium is 5.0 mass ppm or more and 20.0 mass ppm or less, or a concentration of tellurium is 15.0 mass ppm or more and 50.0 mass ppm or less.

It is preferable that the palladium-coated copper bonding wire of the present invention contains one or more of trace elements selected from Au, Pd, Pt, Rh, Ni, In, Ga, P, Ag, Fe, and Tl, of 1 mass ppm or more and 3 mass % or less in total relative to the entire wire.

It is preferable that the palladium-coated copper bonding wire of the present invention contains one or more of trace elements selected from Au, Pd, Pt, Rh, Ni, In, Ga, P, Ag, Fe, and Tl, in which when the palladium-coated copper bonding wire contains one or more selected from Au, Pd, Pt, Rh, and Ni, as the trace elements, a total content thereof is 0.05 mass % or more and 3 mass % or less relative to the entire wire, when the palladium-coated copper bonding wire contains one or more of In and Ga, as the trace elements, a total content thereof is 0.01 mass % or more and 0.7 mass % or less relative to the entire wire, when the palladium-coated copper bonding wire contains P, as the trace element, a content thereof is 5 mass ppm or more and 500 mass ppm or less relative to the entire wire, and when the palladium-coated copper bonding wire contains one or more of Ag, Fe, and Tl, as the trace elements, a total content thereof is 1 mass ppm or more and 100 mass ppm or less relative to the entire wire.

The palladium-coated copper bonding wire of the present invention preferably includes a gold layer on the palladium layer. Further, a diameter of the palladium-coated copper bonding wire is preferably 10 μm or more and 25 μm or less.

A manufacturing method of a palladium-coated copper bonding wire of the present invention is a manufacturing method of a palladium-coated copper bonding wire including: a core material containing copper as a main component; and a palladium layer on the core material, in which a concentration of palladium relative to the entire wire is 1.0 to 4.0 mass %, and a work hardening coefficient in a range of an elongation rate of 2% or more and a maximum elongation rate of ε max % or less, is 0.20 or less. In the manufacturing method of the palladium-coated copper bonding wire, it is preferable to prepare a copper wire rod containing copper as a main component, form a palladium layer on a surface of the copper wire rod, perform drawing on the copper wire rod having the palladium layer formed thereon, and perform intermediate heat treatment at a working ratio from the completion of the formation of the palladium layer of 60% or more and 90% or less. Alternatively, in the manufacturing method of the palladium-coated copper bonding wire, it is preferable to prepare a copper wire rod containing copper as a main component, and containing one or more of trace elements selected from Au, Pd, Pt, Rh, Ni, In, Ga, P, Ag, Fe, and Tl, of 1 mass ppm or more and 3 mass % or less in total relative to the entire wire, form a palladium layer on a surface of the copper wire rod, and perform drawing on the copper wire rod having the palladium layer formed thereon.

A semiconductor device of the present invention includes: a semiconductor chip; an aluminum-containing aluminum electrode provided on the semiconductor chip; a gold or silver-coated external electrode provided outside the semiconductor chip; and the palladium-coated copper bonding wire of the present invention connecting the aluminum electrode and a surface of the external electrode.

In a manufacturing method of the semiconductor device, a free air ball is formed at a tip of the palladium-coated copper bonding wire, the palladium-coated copper bonding wire is subjected to ball bonding to the aluminum electrode via the free air ball, and then a portion of the palladium-coated copper bonding wire apart from the free air ball by a length of the bonding wire is subjected to second bonding to the surface of the external electrode.

The semiconductor device of the present invention preferably forms QFP (Quad Flat Packaging), BGA (Ball Grid Array), or QFN (Quad For Non-Lead Packaging). Further, the semiconductor device of the present invention is preferably for automotive applications.

The sulfur group elements are sulfur (S), selenium (Se), and tellurium (Te).

Effect of the Invention

According to the palladium-coated copper bonding wire of the present invention and the manufacturing method thereof, when used for ball bonding, it is possible to improve leaning resistance, and excellent bonding reliability can be stably maintained for a long period of time even in high-temperature and high-humidity environments. According to the semiconductor device of the present invention and the manufacturing method thereof, the leaning resistance can be improved, and thus it is possible to suppress occurrence of short failure in narrow-pitch bonding, for example, and excellent bonding reliability can be stably maintained for a long period of time even in high-temperature and high-humidity environments.

BRIEF DESCRIPTION OF THE DRAWINGS

FIG. 1A and FIG. 1B are photographs showing examples of shrinkage cavity, in which FIG. 1A shows an unproblematic small shrinkage cavity, and FIG. 1B shows a problematic large shrinkage cavity.

FIG. 4A and FIG. 4B are views for explaining a method of evaluating leaning resistance in examples, in which FIG. 4A is a side view of looping bonding, and FIG. 4B is a plan view of the looping bonding.

DETAILED DESCRIPTION

Hereinafter, embodiments of the present invention will be described in detail.

A palladium (Pd)-coated copper bonding wire of the present embodiment includes a core material containing copper as a main component, and a palladium layer on the core material. Further, a concentration of palladium relative to the entire wire is 1.0 to 4.0 mass %, and a work hardening coefficient in an amount of change of an elongation rate of 2% or more and a maximum elongation rate of $\varepsilon$ max % or less of the palladium-coated copper bonding wire, is 0.20 or less. In the present description, the "work hardening coefficient" means a work hardening coefficient in an amount of change in a range of the elongation rate 2% to the maximum elongation rate $\varepsilon$ max %, unless otherwise specified. The maximum elongation rate is a ratio of elongation (length) of wire when breakage of the wire occurs in a tensile test from an initial length of the wire (before performing the tensile test) to the initial length of the wire, and in a palladium-coated copper bonding wire with a diameter of 10 to 25 µm, the maximum elongation rate thereof may be normally a value in a range of 2 to 20%.

As a result of earnest studies, the present inventors found out that when the work hardening coefficient of the palladium-coated copper bonding wire is 0.20 or less, it is possible to realize quite good leaning resistance. The work hardening coefficient is more preferably 0.18 or less. Further, the smaller the work hardening coefficient, the better, but the work hardening coefficient is preferably 0.05 or more in terms of workability of the wire.

The work hardening coefficient is a value representing a work hardening property of a plastic deformation region when a stress is applied to a predetermined material to deform the material in a tensile test, and a wire with smaller work hardening coefficient exhibits a tendency that it is more unlikely to be deformed by stresses varying from large to small. It was found out that, by setting this work hardening coefficient to 0.20 or less, there is provided an effect of preventing a short failure caused by a contact between adjacent wires.

Figure 5:
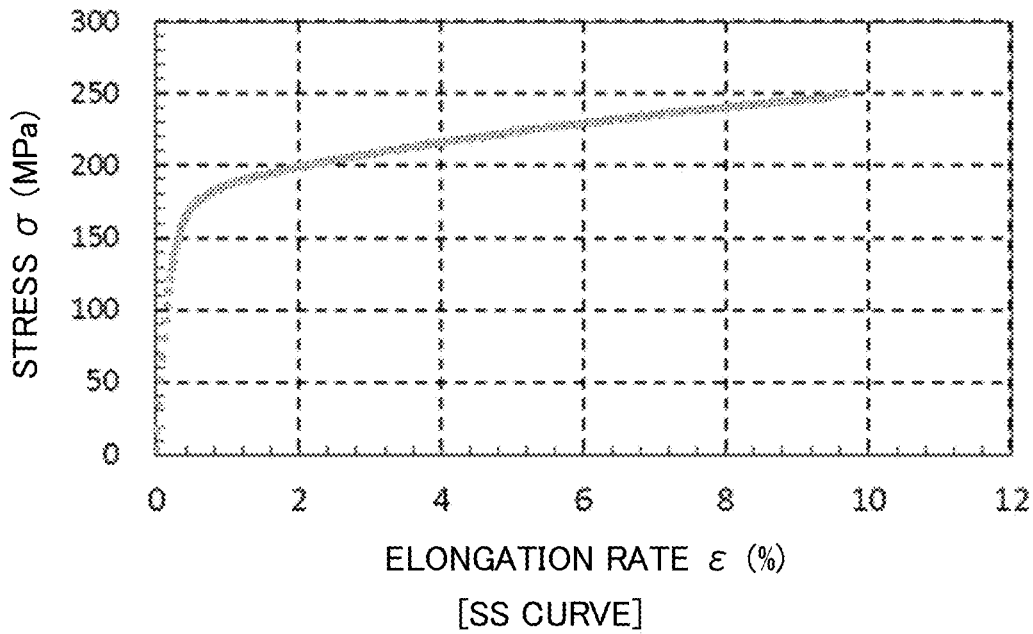
FIG. 5 is a graph illustrating one example of an SS curve.

Here, the work hardening coefficient will be explained. When, at a time of performing a tensile test which is one of tests for measuring a mechanical property of a wire, a force of pulling the wire is increased, the wire is deformed. The force of pulling the wire in the tensile test is generally called "Stress", "σ", "load", "proof stress", or the like. Further, an amount of deformation of the above-described wire is generally called "Strain", "ε", "elongation rate", or the like. In the present description, the force of pulling the wire in the tensile test is referred to as "stress", which is represented by a symbol of σ, and further, the deformation of the wire is referred to as "elongation rate", which is represented by a symbol of ε. A graph representing a relation between the stress and the elongation rate in this tensile test is an SS curve (Stress-Strain curve) in which a vertical axis indicates the stress σ (MPa) and a horizontal axis indicates the elongation rate ε (%). A graph of FIG. 5 illustrates an example of the SS curve. The work hardening coefficient of the wire in the present embodiment can be calculated by using this graph of SS curve. Concretely, the work hardening coefficient can be determined by the following equation (1), as an amount of change in a natural logarithm of the stress relative to an amount of change in a natural logarithm of the elongation rate.

Work hardening coefficient=((amount of change in natural logarithm of stress ($\Delta \ln \sigma$)/(amount of change in natural logarithm of elongation rate($\Delta \ln \varepsilon$)) (1)

Wire looping from a first bonding portion (ball bonding portion) to second bonding (wedge bonding), which is repeatedly performed during wire bonding, is generally performed by automatically controlling a device based on a control program according to a desired looping shape. This control program decides a combination of timings of an operation of a capillary that pays out a wire and opening/closing of a damper, based on a parameter, and a stress according to this parameter is applied to the wire under looping. Other than the above, a stress due to a contact with an already loop-bonded wire, a stress due to a contact with the capillary paying out the wire under looping, or the like, is applied to the wire under looping.

In recent years, an integrated circuit has been made in multistage, and in accordance with this, a loop shape becomes more and more complicated, and to a wire under looping, a large stress for applying a complicated loop shape is continuously applied. In order to form a desired looping shape continuously and with high accuracy, the large stress for applying this loop shape is quite stably maintained by the above-described parameter control. On the other hand, the stress applied to the wire under looping due to the contact with the wire after being subjected to looping bonding or the contact with the capillary, varies from large to small, and further, the stress occurs unexpectedly and thus is unstable.

Since a wire with small work hardening coefficient is unlikely to be deformed by a slight stress, a deformation due to such an unexpected and unstable stress is unlikely to occur, but the wire is stably deformed by a stress which is strongly applied intentionally. For this reason, when the wire with small work hardening coefficient is used, an unintentional partial deformation of the wire under looping can be avoided, resulting in that a slight deformation of the loop shape is suppressed, and it is possible to realize an orderly loop bonding arrangement.

Further, the reason why the value in the amount of change of the elongation rate 2% or more and the maximum elongation rate ε max % or less is employed as the work hardening coefficient, is substantially as follows. Since the deformation occurred in the looping is the plastic deformation, the present inventors thought that the difficulty in the occurrence of plastic deformation of the wire leads to suppression of a short failure caused by the contact between adjacent wires. Further, they focused attention on an inclination of an SS curve in a plastic deformation region of an SS curve graph in a tensile test, as a condition of reflecting the difficulty in the occurrence of plastic deformation, and presumed that the smaller and flatter the inclination of the SS curve is, the more the deformation due to a stress difference can be suppressed.

In a nonferrous metal containing Cu, Ag, or the like as a main component that composes a bonding wire, a starting point of a plastic deformation region is generally approximated to a 0.2% proof stress (stress) point. However, a boundary between an elastic deformation region and the plastic deformation region in the vicinity of the 0.2% proof stress is not always clear, and an elongation rate at the 0.2% proof stress point sometimes does not exist within the plastic deformation region. Based on this, in order to comprehensively consider characteristics regarding the plastic deformation of the wire, the elongation rate 2%, which is larger than the elongation rate at the 0.2% proof stress point, as the range within the plastic deformation region, is employed as a starting point of the amount of change for calculating the work hardening coefficient. Further, a value when the wire is completely elongated, namely, an elongation rate when breakage of the wire occurs (maximum elongation rate $\varepsilon$ max %) is employed as an end point of the amount of change.

Figure 6:
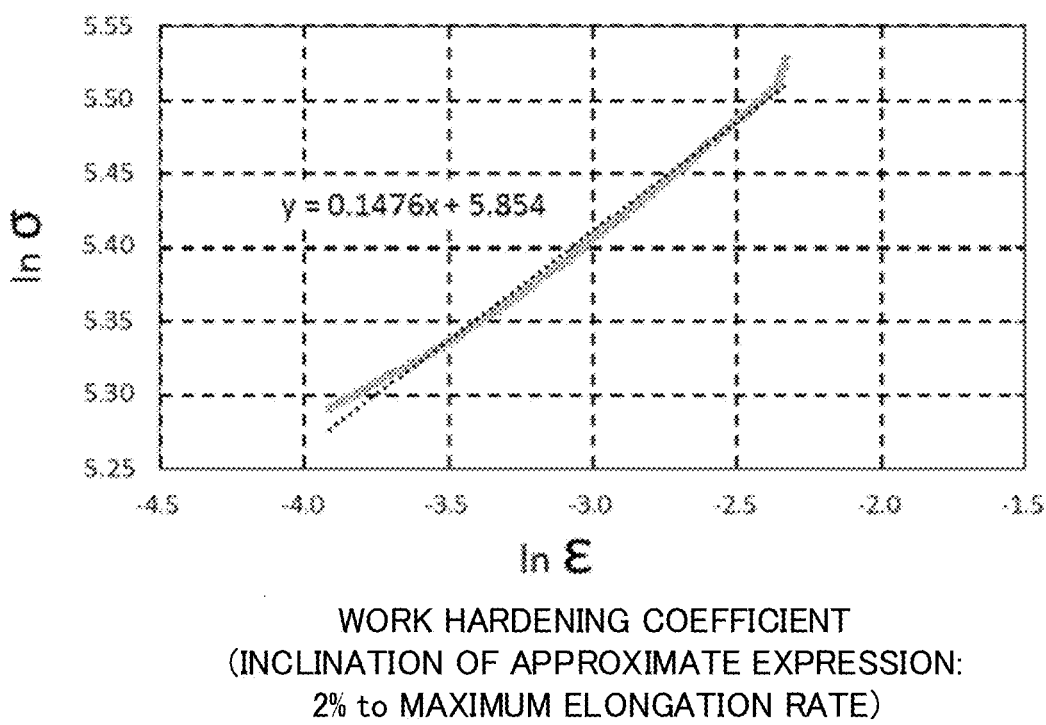
FIG. 6 is a graph illustrating one example of plotting of an amount of change in a natural logarithm of elongation rate ($\Delta \ln \varepsilon$) and an amount of change in a natural logarithm of stress ($\Delta \ln \sigma$).

The "work hardening coefficient in a range of the elongation rate 2% or more and the maximum elongation rate $\varepsilon$ max % or less" in the present embodiment is determined as follows. In the above equation (1), a denominator of "amount of change in natural logarithm of elongation rate ($\Delta$ ln $\varepsilon$)" is represented as (ln maximum elongation rate $\varepsilon$ max−ln 2). Further, as a numerator of "amount of change in natural logarithm of stress ($\Delta$ ln $\sigma$)" in the above equation (1), when values of stresses at the elongation rate 2% and the maximum elongation rate $\varepsilon$ max % are respectively read from the SS curve graph and the values are substituted into the above equation, (ln (stress at maximum elongation rate $\varepsilon$ max %)−ln (stress at elongation rate 2%)) can be obtained. By using these, the work hardening coefficient is a value calculated by (ln (stress at maximum elongation rate $\varepsilon$ max %)−ln (stress at elongation rate 2%))/(ln maximum elongation rate $\varepsilon$ max−ln 2). Further, as illustrated in FIG. 6, it is also possible to determine an approximate expression from plotting of $\Delta$ ln $\varepsilon$ and $\Delta$ ln $\sigma$, and calculate the work hardening coefficient based on an inclination of the expression.

Next, a configuration of the palladium-coated copper bonding wire of the present embodiment will be described. A diameter of the palladium-coated copper bonding wire of the present embodiment is normally 10 to 30 μm, and is preferably 10 to 25 μm. The smaller the diameter of the palladium-coated copper bonding wire, the more suitable it is for narrow-pitch bonding.

In the palladium-coated copper bonding wire of the present embodiment, a concentration of palladium relative to the entire wire is 1.0 to 4.0 mass %. When the concentration of palladium in the palladium (Pd)-coated copper bonding wire of the present embodiment is 1.0 mass % or more, ball bonding reliability can be increased, and thus excellent ball bondability is maintained for a long period of time even under high-temperature and high-humidity. It can be thought that, when the concentration of palladium is 4.0 mass % or less, the occurrence of shrinkage cavity of free air ball (FAB) can be suppressed, and for this reason, it is possible to improve the long-term bonding reliability.

Figure 1A:
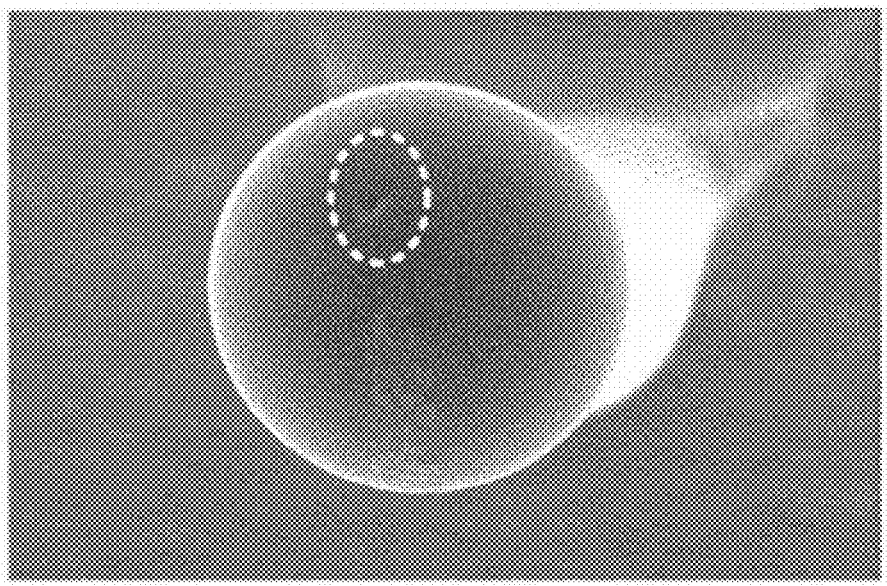
Figure 1B:
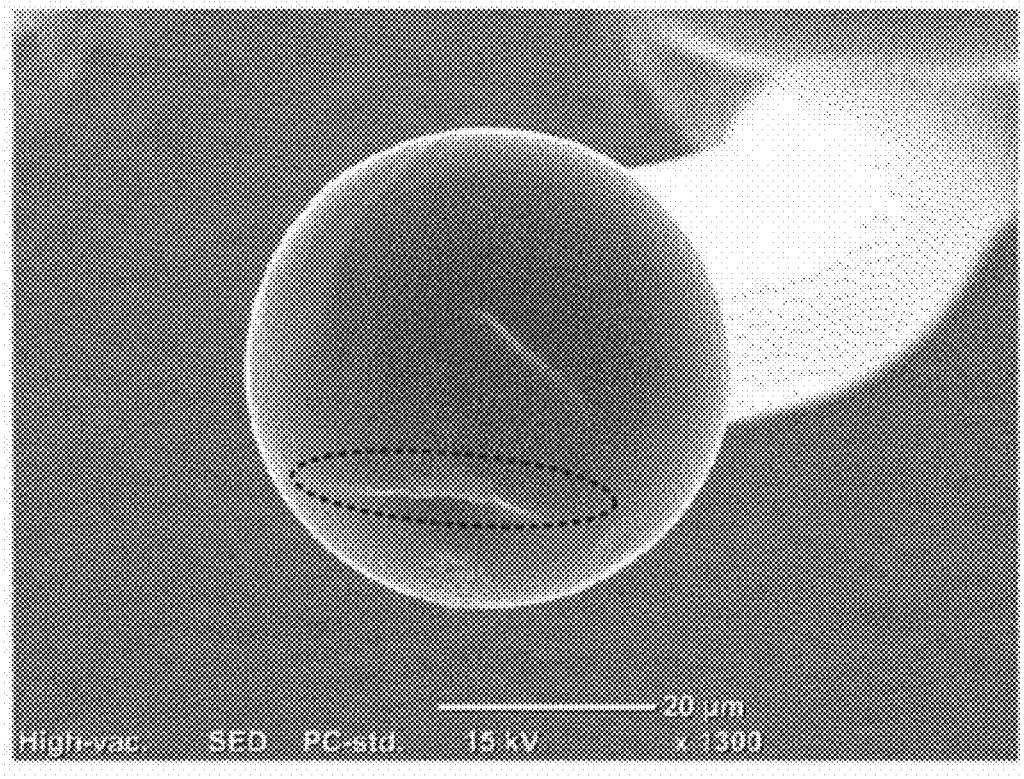

Here, the "shrinkage cavity" is a wrinkle-like groove observed in the surface of the free air ball. FIG. 1A and FIG. 1B are photographs showing examples of shrinkage cavity. FIG. 1A is a photograph of an unproblematic small shrinkage cavity, and FIG. 1B is a photograph of a problematic large shrinkage cavity. When there is a large shrinkage cavity in the surface of the free air ball, it is thought that a void is made in a portion, of a bonding surface of ball bonding of an electrode on a semiconductor chip, corresponding to the above-described groove. Therefore, it is thought that depending on the size of the void, a bonding strength of the bonding surface is weakened with time starting from this void or corrosion is likely to occur, thereby reducing the bonding reliability.

In the palladium-coated copper bonding wire, a concentration of palladium derived from the palladium layer is preferably 1.0 to 2.5 mass % relative to the entire wire. This makes it possible to further increase the high reliability of boning. The palladium-coated copper bonding wire of the present embodiment may also include another layer on the palladium layer. When the palladium-coated copper bonding wire does not include another layer on the palladium layer, the concentration of palladium in the entire wire is the total of the concentration of palladium derived from the palladium layer and the concentration of palladium derived from the copper core material. When the palladium-coated copper bonding wire of the present embodiment includes another layer on the palladium layer, it is possible to determine the concentration of palladium while regarding palladium coming into another layer from the palladium layer through diffusion or the like, and palladium contained in another layer, as palladium derived from the palladium layer.

From the viewpoint of obtaining the high reliability of ball bonding, the concentration of palladium derived from the palladium layer is preferably 1.3 mass % or more, and is preferably 2.3 mass % or less.

The concentration of palladium derived from the palladium layer can be calculated by measuring the concentration of palladium in the entire wire and the concentration of palladium in the copper core material, respectively, and using these. Concretely, the analysis can be performed as follows by secondary ion mass spectrometry (SIMS). First, a wire to be measured is pressed and flattened. A SIMS spectrometer (for example, IMS-7f secondary ion mass spectrometer manufactured by CAMECA) is used to measure the concentration of palladium in a copper (Cu) core material of the flattened wire. A palladium layer of the surface of the above-described flattened wire is removed by sputtering in the above-described spectrometer to expose copper. To expose copper (Cu), for example, a wire with a diameter of 10 μm to 30 μm is sputtered for at least 0.5 μm or more in terms of palladium (Pd) from the surface to remove the palladium layer, and then is analyzed to a depth of 2.0 μm by starting the SIMS analysis. For example, 100 points or more are measured from an analysis start point up to an analysis end point (2.0 μm in depth) to calculate an average concentration of these 100 points. The analysis conditions are as follows: for example, primary ion species of $Cs^+$, a primary ion acceleration voltage of 15.0 keV, a primary ion irradiation region of about 30 μm×30 μm, and an analysis region of about 12 μm×12 μm as the setting conditions of the SIMS spectrometer. In the SIMS analysis, secondary ions released by sputtering while using the primary ions such as $Cs^+$ are detected with a mass spectrometer, and subjected to an elemental analysis, and the concentration of palladium can be determined by converting a measured secondary ion intensity of palladium (Pd) to a concentration using a copper (Cu) wire whose concentration of palladium (Pd) has been already known as a standard sample.

(Copper Core Material)

The core material in the palladium-coated copper bonding wire of the present embodiment is a core material containing copper as a main component, and is made of copper or a copper alloy. The main component means that the component is central in quantity or properties, and the content is at least 50.0 mass %. The properties as the main component are properties required for the configuration, which are, for example, mechanical properties such as a wire breaking force and an elongation rate in the case of the copper core material. The main component can be said to be, for example, a component that centrally affects such properties.

In addition to copper (Cu), the copper core material may also contain trace elements such as inevitable impurities and additive elements which are added in trace amounts for the purpose of improving properties such as oxidation resistance (bonding reliability) and ball formability (circularity) of the palladium-coated copper bonding wire, and the like generally. Such trace elements are, for example, gold (Au), palladium (Pd), platinum (Pt), rhodium (Rh), nickel (Ni), indium (In), gallium (Ga), phosphorus (P), silver (Ag), iron (Fe), thallium (Tl), and so on.

When the copper core material contains one or more selected from Au, Pd, Pt, Rh, Ni, In, and Ga, in particular, among the above trace elements, it is possible to further improve the bonding reliability of the first bonding. When the copper core material contains one or more selected from P, Ag, Fe, and Tl, in particular, among the above trace elements, it is possible to further improve the circularity of the ball bonding portion of the first bonding. The improvement of circularity of the ball bonding portion makes it possible to suppress a short failure in the narrow-pitch bonding. When the copper core material contains the trace elements, a total amount thereof is preferably 1 mass ppm or more relative to the entire core material. A ratio of the trace elements is preferably 3.0 mass % or less, more preferably 2.0 mass % or less, and still more preferably 1.5 mass % or less. Accordingly, high bonding reliability of the first bonding is obtained, an increase in cost can be suppressed as well, and in addition to that, good wire drawability can be maintained. Further, chip damage becomes difficult to occur during the ball bonding. The ratio of the trace elements is more preferably 2.0 mass % or less, and still more preferably 1.5 mass % or less.

Concretely, when the copper core material contains one or more selected from Au, Pd, Pt, Rh, and Ni as the trace elements, a content ratio thereof is preferably 0.05 mass % or more and 3.0 mass % or less in total relative to the entire wire, more preferably 0.1 mass % or more and 2.0 mass % or less, and still more preferably 0.2 mass % or more and 1.0 mass % or less. When the copper core material contains Ni, in particular, as the trace element, a content ratio of Ni is preferably 0.1 mass % or more and 2.0 mass % or less relative to the entire wire, and more preferably 0.3 mass % or more and 1.0 mass % or less.

When the copper core material contains one or more of In and Ga as the trace elements, a total amount thereof, as an amount relative to the entire wire, is preferably 0.01 mass % or more and 0.7 mass % or less, more preferably 0.05 mass % or more and 0.6 mass % or less, and still more preferably 0.1 mass % or more and 0.5 mass % or less. When the copper core material contains P as the trace element, an amount thereof is preferably 5 mass ppm or more and 500 mass ppm or less, more preferably 20 mass ppm or more and 400 mass ppm or less, and still more preferably 50 mass ppm or more and 250 mass ppm or less relative to the entire wire. When the copper core material contains one or more of Ag, Fe, and Tl as the trace elements, a total amount thereof, as an amount relative to the entire wire, is preferably 1 mass ppm or more and 100 mass ppm or less, more preferably 3 mass ppm or more and 60 mass ppm or less, and still more preferably 5 mass ppm or more and 30 mass ppm or less.

The trace elements and the content ratios thereof in the wire are generally measured by a chemical analysis such as an inductively coupled plasma (ICP) emission spectrochemical analysis (AES) or an inductively coupled plasma (ICP) mass spectrometry (MS), but the measurement is not limited thereto.

Note that the palladium-coated copper bonding wire of the present embodiment may contain a sulfur group element in the copper core material. In this case, an amount of the sulfur group element in the copper core material is preferably 0.1 mass % or less relative to the entire wire, by considering the workability of the wire.

A content of the sulfur group element in the copper core material can be analyzed similarly to the above-described method of analyzing the concentration of palladium in the copper core material. Specifically, secondary ion mass spectrometry (SIMS) is performed, and a wire to be measured is first pressed and flattened. A SIMS spectrometer (for example, IMS-7f secondary ion mass spectrometer manufactured by CAMECA) is used to measure the concentration of the sulfur group element in the copper (Cu) core material of the flattened wire. A palladium layer of the surface of the above-described flattened wire is removed by sputtering in the above-described spectrometer to expose copper. To expose copper (Cu), for example, a wire with a diameter of 10 μm to 30 μm is sputtered for at least 0.5 μm or more in terms of palladium (Pd) from the surface to remove the palladium layer, and then is analyzed to a depth of 2.0 μm by starting the SIMS analysis. For example, 100 points or more are measured from an analysis start point up to an analysis end point (2.0 μm in depth) to calculate an average concentration of these 100 points. The analysis conditions are as follows: for example, primary ion species of $Cs^+$, a primary ion acceleration voltage of 15.0 keV, a primary ion irradiation region of about 30 μm×30 μm, and an analysis region of about 12 μm×12 μm as the setting conditions of the SIMS spectrometer. In the SIMS analysis, secondary ions released by sputtering while using the primary ions such as $Cs^+$ are detected with a mass spectrometer, and subjected to an elemental analysis, and the concentration of sulfur group element can be determined by converting a measured secondary ion intensity of the sulfur group element to a concentration using a copper (Cu) wire whose concentration of sulfur group element has been already known as a standard sample. By analyzing the content of the sulfur group element in the entire wire with the ICP-MS and analyzing the content of the sulfur group element of the copper core material with the SIMS in a manner as described above, it is possible to measure the amount of the sulfur group element derived from the copper core material. In this case, although it is not possible to perform the analysis by using samples which are perfectly the same, it can be thought that there is no problem if the analysis is performed by regarding that any portion sampled from the same wire in its longitudinal direction has the same composition.

(Palladium Layer)

The palladium-coated copper bonding wire of the present embodiment includes the palladium layer on the copper core material. The palladium-coated copper bonding wire may include another layer containing another metal other than copper and palladium, as its main component, between the copper core material and the palladium layer, as long as the effect of the present invention is not impaired, but it preferably does not include the other layer. In a case where the other layer does not exist, an Auger (AES) analysis is performed, and when a maximum value of a concentration of palladium in the vicinity of the surface is set to 100% in a depth profile analysis (in terms of $SiO_2$) in a depth direction from the surface of the wire, a point where the concentration of palladium is half the maximum value, namely, 50%, is defined as a boundary portion between palladium and copper. Accordingly, a region from the boundary portion to the surface corresponds to the palladium layer in the palladium-coated copper bonding wire of the present embodiment.

The thickness of the palladium layer is preferably, depending on the diameter of the palladium-coated copper bonding wire, 0.020 μm or more and 0.150 μm or less, and more preferably 0.030 μm or more and 0.130 μm or less when the diameter of the wire is 10 μm to 30 μm. This is because when the thickness of the palladium layer is uniform within the above-described range, the quality of loop characteristics such as the leaning resistance when the bonding wire is bonded and stability of a loop height is improved. As a method of measuring the thickness of the palladium layer, the above-described AES analysis can be used.

The palladium-coated copper bonding wire of the present embodiment preferably contains the sulfur group element (one or more of sulfur, selenium, and tellurium) derived from the palladium layer (and another layer on the palladium layer according to need) of 50.0 mass ppm or less in total relative to the entire wire. When the palladium-coated copper bonding wire contains the sulfur group element, it becomes easy to obtain high reliability of ball bonding.

If the palladium-coated copper bonding wire of the present embodiment contains a predetermined amount of sulfur group element in the palladium layer (and another layer on the palladium layer according to need), when a free air ball (FAB) is formed and its tip portion is analyzed, it is possible to observe, in the vicinity of the surface of the tip portion of FAB, a region which is richer in palladium than the inside of the ball. This palladium-rich region can be observed as a region containing palladium of 6.5 to 30.0 atom % relative to the total of copper and palladium, in a range from the surface of the tip portion of FAB to 5.0 nm or more and 100.0 nm or less in the depth direction. Hereinafter, a case where the sulfur group element is contained in the palladium layer will be explained, but the same explanation is applied also to a case where the sulfur group element is contained in another layer on the palladium layer. Specifically, a concentration of the sulfur group element "derived from the palladium layer" in the following explanation means a concentration as a result of removing a concentration of the sulfur group element derived from the copper core material from a concentration of the sulfur group element relative to the entire wire.

When the palladium-coated copper bonding wire of the embodiment containing the sulfur group element in the palladium layer is used to form a free air ball, most of the palladium remains in the vicinity of the surface without being diffusively absorbed into the inside of the ball during ball melting. The palladium remaining in the vicinity of the surface forms a palladium-concentrated region on the surface of the solidified ball. Therefore, the palladium-concentrated region has the above-described composition as traces of the palladium remaining in the vicinity of the surface of the free air ball before solidification. When the palladium-concentrated region is observed at the surface of the tip portion of the free air ball, it can be presumed that the palladium-concentrated region, which is in a palladium-rich state, is formed in layers in the entire vicinity of the surface of the ball or in a partial range including the tip portion. When bonding to an aluminum electrode, the presence of the palladium-concentrated region at the place of the free air ball where the free air ball and the electrode are bonded, can improve the bonding reliability of the ball bonding (first bonding).

In a case where the palladium-coated copper bonding wire contains the sulfur group element in the palladium layer, when the concentration of the sulfur group element derived from the palladium layer relative to the entire wire, namely, the concentration of the sulfur group element relative to the entire wire calculated as a concentration relative to the entire wire by removing an amount of the sulfur group element derived from the copper core material from the sulfur group element in the entire wire, is 50.0 mass ppm or less in total, cracks of the palladium layer during wire drawing and wire breakage starting from the cracks are difficult to occur, and thus it is easy to obtain good wire drawability. When the palladium-coated copper bonding wire contains the sulfur group element, a ratio of the sulfur group element in the entire wire is preferably 5.0 mass ppm or more, and more preferably 6.0 mass ppm or more, in terms of easiness of obtainment of high reliability of the ball bonding. Further, in order to improve the wire drawability, the concentration of the sulfur group element is preferably 45.0 mass ppm or less, and more preferably 41.0 mass ppm or less.

When the palladium-coated copper bonding wire of the embodiment contains the sulfur group element derived from the palladium layer, a concentration of sulfur (S) derived from the palladium layer is preferably 5.0 mass ppm or more in the entire wire, and more preferably 6.0 mass ppm or more. The concentration of sulfur (S) derived from the palladium layer is 5.0 mass ppm or more, which makes it possible to enhance the ball bonding reliability. On the other hand, the concentration of sulfur (S) derived from the palladium layer is preferably 12.0 mass ppm or less in the entire wire, and when this is satisfied, the palladium layer is unlikely to become brittle, and the wire drawability is likely to be improved. The concentration of sulfur (S) derived from the palladium layer is more preferably 10.0 mass ppm or less in the entire wire.

Further, a concentration of selenium (Se) derived from the palladium layer is preferably 5.0 mass ppm or more in the entire wire, more preferably 6.0 mass ppm or more, and still more preferably 8.0 mass ppm or more. The concentration of selenium (Se) derived from the palladium layer is 5.0 mass ppm or more, which makes it possible to enhance the ball bonding reliability. On the other hand, the concentration of selenium (Se) derived from the palladium layer is preferably 20.0 mass ppm or less in the entire wire, and when this is satisfied, the palladium layer is unlikely to become brittle, and the wire drawability is likely to be improved. The concentration of selenium (Se) derived from the palladium layer is more preferably 15.0 mass ppm or less in the entire wire.

Further, a concentration of tellurium (Te) derived from the palladium layer is preferably 15.0 mass ppm or more in the entire wire, and more preferably 16.0 mass ppm or more. The concentration of tellurium (Te) derived from the palladium layer is 15.0 mass ppm or more, which makes it possible to enhance the ball bonding reliability. On the other hand, the concentration of tellurium (Te) derived from the palladium layer is preferably 50.0 mass ppm or less in the entire wire. If the concentration exceeds 50.0 mass ppm, the palladium layer becomes brittle, so that by setting the concentration to 50.0 mass ppm or less, the wire drawability is likely to be improved. The concentration of tellurium (Te) derived from the palladium layer is more preferably 45.0 mass ppm or less in the entire wire, and still more preferably 41.0 mass ppm or less.

The palladium-coated copper bonding wire used in the present embodiment may contain only one of the sulfur group elements or two or more of them, as long as the total concentration of the sulfur group element derived from the palladium layer is within a range of 50 mass ppm or less and one of sulfur, selenium, and tellurium satisfies the above-described concentration range. As described above, since the palladium-coated copper bonding wire contains each of the sulfur group elements in the palladium layer at the above-described concentration, it has a property such that the palladium-concentrated region is formed on the surface of the tip portion of the free air ball, and the aforementioned palladium-concentrated bonding region is easily formed in the ball bonding portion in a stable manner without depending on the ball forming conditions, resulting in that the bonding reliability can be improved significantly.

The sulfur group element is mainly contained in the palladium layer. However, the amount of the sulfur group element is extremely small, and thus various analytical methods sometimes fail to accurately measure where the sulfur group element is present and the concentration thereof in a configuration with an extremely thin palladium layer, in particular, currently. On the other hand, the amount of the sulfur group element derived from the copper core material can be measured by the above-described method. For this reason, the amount of the sulfur group element is not the content in the palladium layer, but is set to be in the above-described range as a concentration as a result of removing the concentration of the sulfur group element derived from the copper core material from the concentration of the sulfur group element relative to the entire palladium-coated copper bonding wire.

The sulfur group element derived from the palladium layer in the palladium-coated copper bonding wire contributes to the formation of a palladium-distributed region in the vicinity of the surface of the free air ball described above. The sulfur group element is highly reactive with copper, and thus, it is thought that the sulfur group element derived from the palladium layer is concentrated in a region where copper and palladium are in contact, mainly in the early stage when the metal of the wire melts. Reaction products of the sulfur group element and copper concentrated in this region where copper and palladium are in contact are thought to shield palladium from dissolution into the molten copper. From such a viewpoint, the amount of the sulfur group element is decided.

The palladium-coated copper bonding wire of the present embodiment may include, as another layer, a second layer made of metal other than palladium on the palladium layer. The metal of the second layer may be a pure metal, or an alloy of two or more metals. When the palladium-coated copper bonding wire includes the second layer on the palladium layer, the boundary between the palladium layer and the second layer can be measured as a portion where the concentration of the main component metal in the second layer is 50.0% relative to the maximum concentration. In the case of including a third layer and a fourth layer on the surface of the second layer, the analysis can be performed according to the above.

(Gold Layer)

The palladium-coated copper bonding wire of the present embodiment preferably includes a gold layer in the outermost layer as another layer other than the palladium layer. The palladium-coated copper wire of the present embodiment includes the gold layer, thereby making it possible to improve bondability of the second bonding and reduce die wear during wire drawing simultaneously. The gold layer is a layer formed of gold as its main component. The gold layer may be partially interrupted as long as it is formed over the surface of the palladium layer, and palladium may be contained in the gold layer. When palladium is contained in the gold layer, the concentration of palladium may be uniform in the thickness direction or may have a concentration gradient that decays toward the surface.

Further, when the gold layer is formed of an alloy of two or more metals, the gold layer may contain silver, copper, and so on in addition to palladium and gold as long as the effect of the present invention is not impaired. In this case, the amount of metal elements other than palladium in the gold layer is, for example, less than 50.0 mass % relative to the entire gold layer.

When the palladium-coated copper bonding wire of the present embodiment includes the gold layer, the concentration of gold derived from this gold layer in the entire wire is preferably 0.01 mass % or more, and more preferably 0.05 mass % or more. When the concentration of gold derived from the gold layer is 0.01 mass % or more, the second bondability tends to improve and the die wear during wire drawing is reduced easily. The concentration of gold derived from the gold layer in the entire wire is preferably 0.20 mass % or less, and more preferably 0.15 mass % or less. When the concentration of gold derived from the gold layer is 0.20 mass % or less, it is less likely to adversely affect the wire performance and less likely to impair the sphericity of the free air ball. Note that when the copper core material contains gold, the concentration of gold in the entire wire is the total of the concentration of gold derived from the above-described gold layer and the concentration of gold in the copper core material. Therefore, when measuring the concentration of gold derived from the gold layer, the concentration of gold in the entire wire and the concentration of gold in the copper core material can be measured respectively, to calculate the concentration of gold derived from the gold layer using these concentrations. The concentration of gold derived from the gold layer can be measured by the SIMS analysis concretely in the same manner as the concentration of palladium derived from the above-described palladium layer.

The thickness of the gold layer is preferably, depending on the diameter of the palladium-coated copper bonding wire, 8 nm or less, and more preferably 5 nm or less. When the thickness of the gold layer is 8 nm or less, it is easy to maintain high reliability of the ball bonding without impairing the sphericity of the free air ball even with the gold layer. A lower limit of the thickness of the gold layer is not particularly limited, but it is sufficient as long as a later-described concentration-converted average film thickness is 1 nm or more. As a method of measuring the thickness of the gold layer, the AES analysis can be used as in the case of the palladium layer.

Note that the thickness of the gold layer becomes significantly thin when the concentration of gold in the entire wire is in the above-described preferred range. When the thickness of the gold layer becomes significantly thin as above, it is currently difficult to accurately measure the thickness of the gold layer by using general measurement methods. Therefore, when the thickness of the gold layer becomes significantly thin, the thickness of the gold layer can be evaluated by the concentration-converted average film thickness, which is calculated using the concentration of gold in the entire wire and the diameter of the wire. Examples of a method of obtaining this concentration-converted average film thickness include: a method of calculating the mass of gold per unit length based on the concentration of gold and the specific gravity of gold, and then determining the film thickness by assuming that the cross section of the wire is a perfect circle and gold is uniformly present on the uppermost surface; and a method of performing a proportional calculation using a thickness of a gold coating at a plated wire diameter (which may be a design value), and a final wire diameter.

<Manufacturing Method of Palladium-Coated Copper Bonding Wire>

Next, a manufacturing method of the palladium-coated copper bonding wire of the present embodiment will be described. The palladium-coated copper bonding wire of the present embodiment is obtained by coating the surface of a copper wire rod, which contains, as its main component, copper to be a core material, with palladium, performing wire drawing, and performing heat treatment as necessary. Gold coating may be performed after the palladium coating, or wire drawing and heat treatment may be performed in stages after palladium or gold coating is performed.

When copper is used as the core material, copper of a predetermined purity is melted, and when a copper alloy is used, copper of a predetermined purity is melted together with trace elements to be added, to thereby obtain a material of a copper core material or a material of a copper alloy core material. A heating furnace such as an arc heating furnace, a high-frequency heating furnace, a resistance heating furnace, or a continuous casting furnace is used for melting. For the purpose of preventing mixture of oxygen and hydrogen from the atmosphere, the atmosphere during copper melting in the heating furnace is preferably maintained to a vacuum or an inert gas atmosphere such as argon or nitrogen. The molten material of the core material is cast and solidified to a predetermined wire diameter from the heating furnace, or the molten material of the core material is cast into a mold to make an ingot, and the ingot is repeatedly rolled and then is drawn to a predetermined wire diameter, and a copper wire rod is obtained.

Examples of the method of coating the surface of the copper wire rod with palladium or gold include a plating method (wet method) and a vapor deposition method (dry method). The plating method may be either an electrolytic plating method or an electroless plating method. Electrolytic plating, such as strike plating or flash plating, is preferable because a plating speed is fast and the adhesion of the palladium layer to the core material is good when the electrolytic plating is used for palladium plating. As a method of containing the sulfur group element in the palladium layer by the plating method, there is a method of using a plating solution containing a plating additive containing sulfur, selenium, or tellurium for a palladium plating solution, and adjusting the type and amount of the plating additive in the aforementioned electrolytic plating. This also makes it possible to adjust the concentration of the sulfur group element derived from the palladium layer.

As the vapor deposition method, physical adsorption such as a sputtering method, an ion plating method, or vacuum vapor deposition, and chemical adsorption such as plasma CVD can be used. According to these methods, it is not necessary to clean the palladium coating or the gold coating after formation, and there is no concern about surface contamination or the like during cleaning. As a method of containing the sulfur group element in the palladium layer by the vapor deposition method, there is a method of forming a palladium layer by magnetron sputtering or the like while using a palladium target containing the sulfur group element.

In this manner, the copper wire having palladium coating and the other coating of gold or the like according to need is subsequently drawn to a final wire diameter and heat-treated. The wire drawing and the heat treatment may be performed in stages. Further, in the above, the method of drawing the palladium-coated and gold-coated copper wire rod to a final wire diameter has been described, but the palladium-coated copper wire rod is drawn to a predetermined wire diameter.

A worked texture is formed in the process of drawing the copper wire rod, recovery and recrystallization progress to form a recrystallized texture in the heat treatment process, and these textures relate to each other to exert an influence on the work hardening coefficient. After the formation of the palladium coating and the other coating formed according to need, heat treatment conditions are set properly, which enables to adjust the work hardening coefficient of the palladium-coated copper bonding wire. Normally, it is possible to adjust the work hardening coefficient based on the timing and the number of times of intermediate heat treatment after the formation of coating. Concretely, by performing, after the formation of coating, plural times of heat treatment at a working ratio of 60% to 90% from a diameter of the coated wire, it becomes easy to adjust the work hardening coefficient in a range of the elongation rate 2% or more and the maximum elongation rate ε max % or less, to 0.2 or less. For example, a temperature of the intermediate heat treatment is 300° C. to 600° C., and when the temperature is a temperature of the surface of the wire, it is sufficient that a time for one time of heat treatment is one second or more. When the other conditions are the same, the higher the temperature of the intermediate heat treatment or the larger the number of times of the intermediate heat treatment, the smaller the work hardening coefficient tends to be.

Further, even if the heat treatment temperature is the same, the properties of the wire are sometimes influenced by a structure and a speed of a heat treatment apparatus. Further, even if the heat treatment conditions are the same in the same apparatus, the properties of the wire are sometimes influenced by the type and the amount of the trace elements in the core material. Regarding this point, by adjusting not only the above-described intermediate heat treatment conditions but also a reduction of area of die per one time in the manufacturing process of the palladium-coated copper bonding wire of the present embodiment, it becomes easy to adjust the work hardening coefficient in a range of the elongation rate 2% or more and the maximum elongation rate ε max % or less, to 0.2 or less.

The wire drawing is preferably performed in stages by using plural diamond dies. The wire drawing is performed at a reduction of area (working ratio) per one diamond die of normally 5.0 to 15.0%, by taking productivity and workability into consideration. However, in order to set the work hardening coefficient to fall within a range of 0.2 or less, it is preferable to perform the wire drawing at the reduction of area per one diamond die of 7.5% or less. Consequently, although the productivity is somewhat reduced, it becomes easy to adjust the work hardening coefficient to 0.2 or less.

In the final heat treatment, there is performed the strain relief heat treatment to relieve strain of a metal structure remaining inside the wire at the final wire diameter. The temperature and the time of the strain relief heat treatment (refining heat treatment) are decided while taking the crystal orientations of the cross section of the wire and the wire properties into consideration. The elongation rate is a value obtained by a tensile test of a bonding wire. Regarding the maximum elongation rate, for example, a bonding wire with a length of 100 mm was kept pulled at a rate of 20 mm/min by using a device for tensile experiment (AUTO COM manufactured by T.S.E Co., Ltd.), and when breakage of the wire occurred, a ratio indicating how much the sample was elongated from its original length (100 mm), was calculated as the maximum elongation rate. If, tentatively, in a tensile test of a sample with a length of 100 mm, a length of the sample when breakage thereof occurs is 120 mm, the maximum elongation rate max is calculated as 20%. The stress is a force applied to the wire pulled at the aforementioned rate, and normally, it is automatically calculated by a load cell by converting a tensile force into an electrical signal. As the elongation rate, it is desirable to determine an average value of five wires, in consideration of a variation in measured results.

As a method of the heat treatment, running heat treatment, in which a wire is passed through an atmosphere of a heating vessel heated to a predetermined temperature to be heat-treated, is preferable because the heat treatment conditions can be adjusted easily. In the case of the running heat treatment, the heat treatment time can be calculated by the speed at which the wire passes and the distance of the wire passing in the heating vessel. A tubular electric furnace or the like is used as the heating vessel.

According to the palladium-coated copper bonding wire of the present embodiment explained above, the ball bonding reliability is excellent even under the high-temperature and high-humidity, and further, it is possible to improve the leaning resistance. Therefore, since the wire bonding structure with quite high long-term reliability can be formed, the palladium-coated copper bonding wire of the present embodiment is suitable for QFP (Quad Flat Packaging), BGA (Ball Grid Array), and QFN (Quad For Non-Lead Packaging). Further, since the wire bonding structure with high reliability can be formed, the palladium-coated copper bonding wire of the present embodiment is suitable for use in high-temperature and high-humidity environments, such as in devices for automobile use. Furthermore, since the leaning resistance is improved, the palladium-coated copper bonding wire of the present embodiment is also suitable for a narrow-pitch bonding structure of a small-sized semiconductor device and the like.

<Semiconductor Device and Manufacturing Method Thereof>

Figure 2:
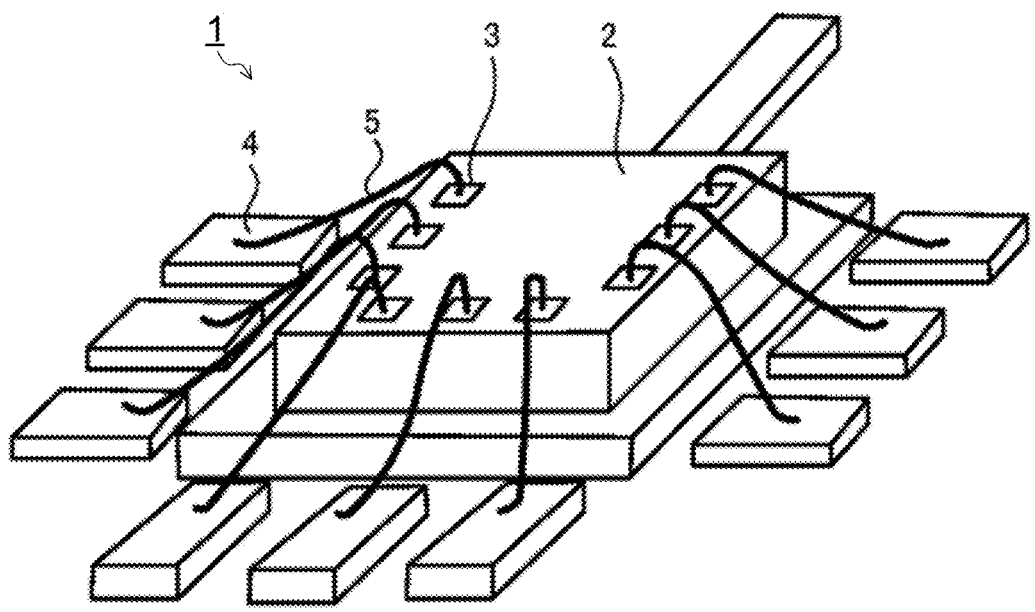
FIG. 2 is a schematic view illustrating a semiconductor device in an embodiment.

Next, a semiconductor device using the palladium-coated copper bonding wires in the above-described embodiment will be described. As illustrated in FIG. 2, a semiconductor device 1 of the present embodiment includes a semiconductor chip 2, aluminum-containing aluminum electrodes 3 provided on the semiconductor chip 2, gold-coated external electrodes 4 provided outside the semiconductor chip 2, and bonding wires 5 connecting the aluminum electrodes 3 and surfaces of the external electrodes 4. Note that in FIG. 2, the case of having a gold coating on the external electrode is explained as an example, but the same is applied even if a silver coating is provided in place of the gold coating or a silver coating is provided together with the gold coating.

In the semiconductor device 1, the bonding wire 5 is made of the palladium-coated copper bonding wire in the above-described embodiment.

The semiconductor chip 2 is made by including an integrated circuit (IC) made of a silicon (Si) semiconductor, a compound semiconductor, or the like. The aluminum electrode is formed, for example, by coating a surface of a silicon (Si) base material with an electrode material such as Al, AlSiCu, or AlCu. The external electrode 4 is provided in the vicinity of the semiconductor chip 2, and is an electrode for supplying power to the semiconductor chip 2 from the outside. The power from the external electrode 4 is supplied to the semiconductor chip 2 via the bonding wire 5.

In the manufacture of the semiconductor device 1 of the present embodiment, the connection of the aluminum electrode 3 and the external electrode 4 by the bonding wire 5 is made as follows, for example. Using a bonding device, a capillary jig used for the connection by passing a bonding wire through its inside, and so on, for example, heat is input to the tip of the wire gripped by the capillary by arc discharge, to heat and melt the tip of the wire. Thereby, a free air ball is formed at the tip of the wire. After that, for example, with the semiconductor chip 2 heated within a range of 140 to 200° C., this free air ball is crimped and bonded onto the aluminum electrode 3 to form ball bonding (first bonding). Thereafter, the opposite end of the bonding wire 5 apart from the first bonding by a predetermined interval is directly subjected to wedge bonding (second bonding) to the external electrode 4 by ultrasonic crimping.

In the manufacturing method of the semiconductor device of the present embodiment, the free air ball forming conditions are as follows: when the diameter of the bonding wire 5 is 10 to 30 μm, preferably 15 to 25 μm, and more preferably 18 to 20 μm, a bonder apparatus is used and an arc discharge current value is 30 to 90 mA. In normal bonding, arc discharge conditions are set so that the diameter of the free air ball is more than 1.7 times and 2.3 times or less the diameter of the wire. In the case of the narrow-pitch bonding, although depending on a width of an electrode interval, for example, when the diameter of the bonding wire 5 is 18 μm, the arc discharge conditions are set so that the diameter of the free air ball is 1.5 to 1.7 times the diameter of the wire. For a bonder apparatus, a commercially-available product such as a bonder apparatus (fully automatic Cu wire bonder; IConn ProCu PLUS) manufactured by KANDS Co., Ltd., for example, can be used. When using such a bonder apparatus, the apparatus is preferably set that a discharge time is 50 to 1000 μs, an EFO-Gap is 25 to 45 mil (about 635 to 1143 μm), and a tail length is 6 to 12 mil (about 152 to 305 μm). When another bonder apparatus other than this bonder apparatus is used, the conditions only need to be the same as above, which are, for example, the condition under which the diameter of the free air ball becomes the same size as above. Further, in order to make a mixed gas atmosphere of nitrogen and hydrogen or a nitrogen gas atmosphere for the tip portion of the wire, the above-described gas is sprayed at a gas flow rate of 0.2 to 0.8 L/minute, and preferably 0.3 to 0.6 L/minute. The gas when forming the free air ball is preferably a mixed gas of 95.0 vol % of nitrogen and 5.0 vol % of hydrogen, and the diameter of the free air ball may be within the above-described range as the target value.

Figure 3:
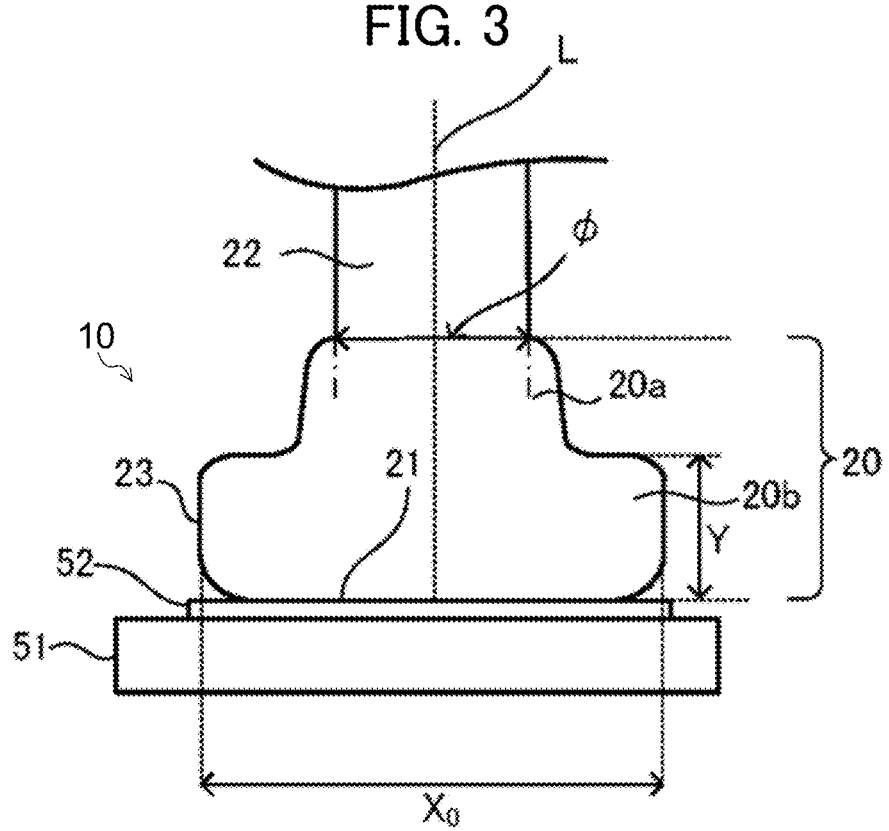
FIG. 3 is a view schematically illustrating a cross section of a ball bonding portion in the semiconductor device in the embodiment.

FIG. 3 is a schematic sectional view illustrating one example of a wire bonding structure 10 of the present embodiment. The wire bonding structure 10 illustrated in FIG. 3 is formed by making a palladium-coated copper bonding wire to be ball-bonded to a surface of an aluminum-containing electrode 52 on a silicon (Si) substrate 51. FIG. 1 represents a cross section of this wire bonding structure 10, cut at a plane passing through a center line L in a wire longitudinal direction of the palladium-coated copper bonding wire and parallel to the center line L. The wire bonding structure 10 includes a ball bonding portion 20, a bonding surface 21, and a wire portion 22 formed of the above-described palladium-coated copper bonding wire. A wire diameter $\phi$ of the wire portion 22 is equal to a diameter of the palladium-coated copper bonding wire.

The ball bonding portion 20 is formed of a first ball compressed portion 20a on its upper side and a second ball compressed portion 20b on its lower side. When performing ball bonding, a free air ball formed at a tip of the palladium-coated copper bonding wire is pressure-bonded onto the electrode 52, in which the first ball compressed portion 20a is a portion which relatively maintains a shape of the free air ball before being subjected to ball bonding, and the second ball compressed portion 20b is a portion formed by the free air ball being crushed and deformed. Further, a surface 23 is a surface of the second ball compressed portion 20b. In the drawing, $X_0$ is a maximum width of the second ball compressed portion 20b in a direction parallel to the bonding surface 21 (a direction vertical to the center line L of the wire), and Y is a maximum height of the second ball compressed portion 20b from the bonding surface 21. Note that when the bonding surface 21 is difficult to be specified, there is no problem if the measurement is performed with the maximum width of the second ball compressed portion 20b in a direction vertical to the center line L of the wire, since $X_0$ in that case also takes an equivalent value. Y may also be calculated by a maximum height based on a contact point between the free air ball and the electrode 52. Note that regarding a size, a direction, and so on of the respective portions in the ball bonding portion 20, a range of error of measurement or the like is allowed as a matter of course.

Further, the conditions of the ball bonding and the wedge bonding can be appropriately adjusted according to the structure and the application of the semiconductor device, and, for example, regarding a wire whose diameter $\phi$ is 18 µm and on which a free air ball with a diameter of 32 µm is formed, a ball crimping force is 7.5 gf, an ultrasonic application output is 70 mA, a ball crimping time is 15 ms, and a crimping temperature is 150° C., as settings of the bonder apparatus. Accordingly, it is possible to form ball bonding in which the height Y of the second ball compressed portion 20b is approximately 10 µm, and the maximum width $X_0$ of the second ball compressed portion 20b in a direction substantially parallel to the bonding surface 21 is approximately 40 µm. The wedge bonding can be performed with a loop length of 2 mm under conditions of, in a scrubbing mode, a crimping force of 70 gf, a crimping time of 20 ms, a crimping temperature of 150° C., a frequency of 200 kHz, an amplitude of 3.0 µm, and 2 cycles.

In summary, the manufacturing method of the semiconductor device of the embodiment is a manufacturing method of a semiconductor device including: a semiconductor chip; an aluminum-containing aluminum electrode provided on the semiconductor chip; a gold-coated or silver-coated external electrode provided outside the semiconductor chip; and a bonding wire connecting the aluminum electrode and a surface of the external electrode, in which the bonding wire is made of a palladium-coated copper bonding wire including: a core material containing copper as a main component; and a palladium layer on the core material, and containing a sulfur group element, in which a concentration of palladium is 1.0 mass % or more and 4.0 mass % or less relative to the total of copper, palladium, and the sulfur group element of the palladium-coated copper bonding wire, and a work hardening coefficient in a range of an elongation rate 2% or more and a maximum elongation rate ε max % or less is 0.20 or less. Further, a free air ball is formed at a tip of the palladium-coated copper bonding wire, the palladium-coated copper bonding wire is bonded to the aluminum electrode via the free air ball, and a portion of the palladium-coated copper bonding wire apart from the free air ball by substantially a length of the bonding wire is subjected to second bonding to the surface of the external electrode.

The semiconductor device of the embodiment is suitable for QFP (Quad Flat Packaging), BGA (Ball Grid Array), and QFN (Quad For Non-Lead Packaging) used in printed wiring boards, and the like, for example.

According to the semiconductor device of the present embodiment explained above, in the wire bonding, the leaning resistance can be improved, and the ball bonding reliability is excellent even under the high-temperature and high-humidity. Therefore, since a bonding structure with quite high long-term reliability can be formed, the semiconductor device of the present embodiment is suitable for use in high-temperature and high-humidity environments, such as in devices for automobile use. Further, according to the manufacturing method of the semiconductor device of the present embodiment, since a bonding structure with improved leaning resistance and with high long-term reliability is formed, it is possible to obtain a semiconductor device suitable for use in high-temperature and high-humidity environments, such as in devices for automobile use.

EXAMPLES

Next, examples will be explained. The present invention is not limited to the following examples. Examples 1 to 33 are examples, and Examples 34 to 36 are comparative examples.

Copper (Cu) with a purity of 99.99 mass % or more was used as the core material, this was continuously cast and rolled while preheat treatment being performed thereon, and then drawn, to thereby obtain a copper wire rod with a diameter of 400 µm to 600 µm. Regarding a wire containing trace elements and a sulfur group element in the copper core material, a copper alloy to which the respective trace elements and the sulfur group element were added to satisfy predetermined concentrations described in respective Tables was used to obtain a copper alloy wire rod in the same manner as above. For the trace elements and the sulfur group element, raw materials each having a purity of 99.99 mass % or more were used. Although the following is the explanation regarding the case where the palladium-coated copper bonding wire using the copper wire rod is manufactured, the same applies to the case where the copper alloy wire rod containing the trace elements and the sulfur group element is used.

The palladium coating layer was formed as follows. Commercially-available palladium electroplating baths or the commercially-available palladium electroplating baths to which predetermined amounts of additives containing sulfur, selenium, and tellurium were added, were used. Regarding examples in which the sulfur group elements were added, the plating paths were respectively prepared by controlling the concentrations of sulfur, selenium, and tellurium in the plating baths so that the concentrations of the sulfur group elements derived from the palladium layer relative to the entire wire (the total of copper, palladium, and sulfur group elements) would be the concentrations described in respective Tables below. With the copper wire rod immersed in the plating bath, a palladium coating was formed. In the case of forming a palladium coating containing two or more of sulfur, selenium, and tellurium, a plating bath containing two or more of the above-described additives was used.

Thereafter, drawing was performed with diamond dies at a working ratio of 60 to 90% in total from the completion of the formation of palladium coating or the completion of the formation of gold coating in a case of further coating the surface of palladium coating with gold, and after that, heat treatment was carried out for 0.3 to 5 seconds at 300° C. to 600° C. Depending on samples, the drawing and the heat treatment were performed in combination plural times in a repeated manner. After that, drawing was performed to a final wire diameter, and final refining heat treatment was performed at 300° C. to 600° C., to thereby obtain a palladium-coated copper bonding wire with a diameter of 18 µm. Note that the working ratio calculated by a reduction of area of wire cross sections from the wire after coating to the final wire diameter, is in a range of 99.0% or more, and the wire speed in the wire drawing is 100 to 1000 m/minute.

More concretely, in Example 1, the palladium-coated copper wire rod with a diameter of 500 µm was continuously drawn with diamond dies with a reduction of area of 12%, until the working ratio reached 75%. Next, heat treatment was performed at 500° C. for 3 seconds, and thereafter, the wire rod was continuously drawn to a final wire diameter with diamond dies with a reduction of area of 4.8%. After that, refining heat treatment was performed at 500° C. for 3 seconds, to thereby obtain a palladium-coated copper bonding wire. In other examples, a wire diameter during coating, a reduction of area of diamond dies, heat treatment conditions, a wire speed in the wire drawing, and so on were respectively adjusted, to obtain palladium-coated copper bonding wires of the respective examples. Note that this manufacturing condition is one example, and even under conditions other than this, it is possible to realize the work hardening coefficient of the present invention by appropriately performing adjustment.

A palladium-coated copper bonding wire including a gold layer was produced as follows. In the manufacturing process of the above-described palladium-coated copper bonding wire, after coating with palladium, gold plating was further applied by using a commercially-available gold plating bath.

The concentration of palladium in the palladium-coated copper bonding wire in which palladium was not added to the copper core material, was measured as follows. The manufactured wire was dissolved in aqua regia, and the concentration of palladium (Pd) in the solution was determined by high-frequency inductively coupled plasma emission spectroscopy (ICPS-8100 manufactured by Shimadzu Corporation). Consequently, the concentration of palladium derived from the palladium layer was determined, and the result is shown in the column of "Pd (derived from Pd layer)" in Table below. In the example of containing palladium (Pd) in the copper core material as the trace element, the concentration of palladium and the concentration of the sulfur group element derived from the palladium layer were calculated by measuring the concentration of palladium in the copper core material based on the secondary ion mass spectrometry (SIMS) and using the concentration of palladium and the concentration of the sulfur group element in the entire wire and the concentration of palladium and the concentration of the sulfur group element in the copper core material, as described above. Note that in Table below, an abbreviated name of "mass" means mass.

The concentration of the other trace elements in the palladium-coated copper bonding wire was measured as follows. The manufactured wire of about 100 m was dissolved in aqua regia, and the concentration of trace elements such as sulfur (S), selenium (Se), tellurium (Te), and platinum (Pt) in the solution was determined by an inductively coupled plasma mass spectrometer (Agilent 8800 manufactured by Agilent Technologies Japan, Ltd.).

The compositions of the palladium-coated copper bonding wires of examples and comparative examples obtained above are shown in Table below. The thickness of the gold layer is the value determined by calculating the mass of gold per unit length from the concentration of gold and the specific gravity of gold, and assuming that the wire having a unit length has a perfectly circular cross section and gold is uniformly present on the uppermost surface of the wire having a unit length. Next, the following property evaluations were performed on the palladium-coated copper bonding wires obtained above.

(Observation of Crack in Wire Surface)

The copper wire rod after palladium plating (after gold coating regarding the copper wire rod having a gold layer) was subjected to a torsion test, and a crack in a wire surface was observed. Regarding the presence/absence of the crack in the wire surface, the appearance of the surface of the wire rod after being subjected to the torsion test was observed with an optical stereomicroscope (product name: SZX16 manufactured by Olympus Corporation) to perform evaluation based on whether a crack of palladium had reached copper of the core material. Ten test pieces were used, in which a case where all of the ten test pieces had no crack was evaluated as very good (A) because there were no cracks in the wire surfaces, a case where there were one or more wires with cracks which did not reach copper and the other wires had cracks which did not reach copper, was evaluated as good (B) because there was no problem of cracks in the wire surfaces, and a case where there was even one wire with a crack which reached copper, was evaluated as defective (x) because there was a problem of cracks in the wire surfaces. In the torsion test method, a device manufactured by MAEKAWA TESTING MACHINE MFG. Co., Ltd. (device name: TO-202) was used, both ends of a sample wire sampled from the wire by about 20 cm were fixed and rotated 180 degrees clockwise and 180 degrees counter-clockwise, the rotations being performed for 5 sets, and then the appearance was observed. Results are shown in Table below.

(Work Hardening Coefficient)

The work hardening coefficient was also calculated from the SS curve graph in the tensile test in the above-described manner. As a device for the tensile test, one same as the above-described device was used, and an elongation rate when breakage of wire occurred (maximum elongation rate) and a stress at that time were measured. Also in this case, the test was performed on ten samples, and an average value thereof was determined and shown in Table 1.

(Formation of Free Air Ball)

With the palladium-coated copper bonding wire with a diameter of 18 µm obtained by the above-described manufacturing method, a free air ball with a ball diameter (FAB diameter) of about 32 µm (about 1.8 times the diameter of the wire) was formed in a (fully automatic Cu wire bonder;

IConn ProCu PLUS) type ultrasonic device manufactured by KANDS Co., Ltd. by setting an arc discharge current value (Electronic Flame-Off (EFO) current value) to 65 mA and adjusting a discharge time in a range of 50 to 1000 μs. A free air ball forming atmosphere was a mixed gas of 95.0 vol % of nitrogen gas and 5.0 vol % of hydrogen gas, and the gas was sprayed onto the tip of the wire at a gas flow rate of 5.0 L/minute.

(Shrinkage Cavity)

The shrinkage cavity evaluation regarding the free air balls obtained above was performed as follows. When there was a shrinkage cavity in the surface of the free air ball, the shrinkage cavity was observed with the SEM or the like, in which a case where a maximum length of the shrinkage cavity was a length equal to or less than two-thirds of the diameter of the wire, was evaluated as having no problem and set to A, and a case where the maximum length of the shrinkage cavity exceeded the length of two-thirds of the diameter of the wire, was evaluated as having a problem and set to X. For example, when the diameter of the wire is 18 μm, a shrinkage cavity with a maximum length of greater than 12 μm is evaluated as a problematic large shrinkage cavity, and it can be presumed that a shrinkage cavity whose maximum length is equal to or less than 12 μm does not exert influence on the bonding reliability almost at all. Note that regarding the samples which were evaluated as X in the shrinkage cavity evaluation, no further evaluation was conducted, which was described as "not-evaluated" in Table 2.

(First Bonding)

A free air ball was formed under the above-described conditions, and the first bonding (ball bonding) thereafter was performed as follows. Ball bonding conditions (a ball crimping force of 7.5 gf, an ultrasonic application output of 70 mA, a ball crimping time of 15 ms, and a crimping temperature of 150° C.) were adjusted in a bonder apparatus so as to make the height Y of the second ball compressed portion 20b to be about 10 μm, and the maximum width $X_0$ of the second ball compressed portion 20b in a direction parallel to the bonding surface 21 to be about 40 μm (about 1.2 to 1.3 times the ball diameter), and ball bonding was formed on an aluminum electrode of a chip.

(Second Bonding)

Further, in the second bonding, wedge bonding was performed under conditions of, in a scrubbing mode, a crimping force of 70 gf, a crimping time of 20 ms, a crimping temperature of 150° C., a frequency of 200 kHz, an amplitude of 3.0 μm, and 2 cycles, with a loop length of 2 mm (Circularity)

In the evaluation of the circularity of the ball portion in the bonding described above, bonded balls were observed from above regarding the first bonding of 100 wires, a maximum width of a crimped ball and a width orthogonal to the maximum width were measured, and a ratio between the maximum width and the width orthogonal to the maximum width (maximum width/width orthogonal to maximum width) was determined. When an average value of the ratios of the above-described 100 wires was 1.00 or more and less than 1.10, it was evaluated as extremely good (A), when the average value was 1.10 or more and less than 1.15, it was evaluated as good (B), and when the average value was 1.15 or more, it was evaluated as defective (X) since there was a problem.

(Leaning Resistance)

Figure 4A:
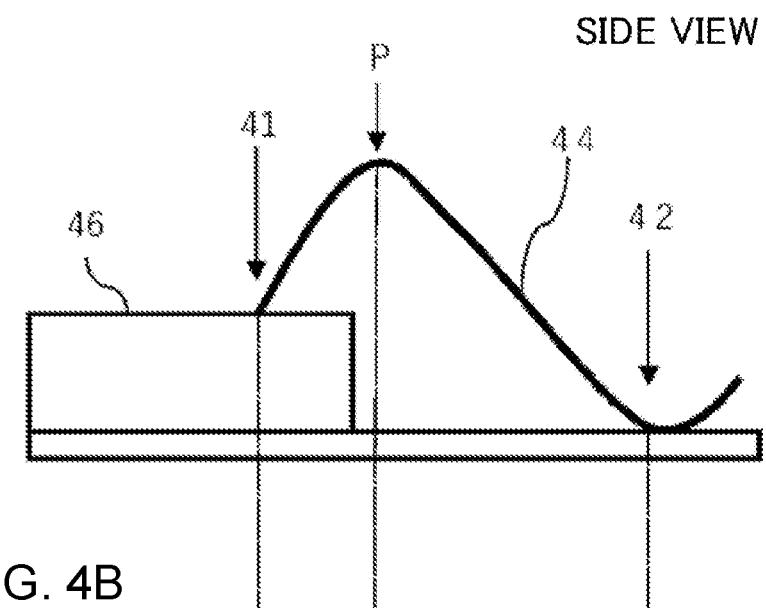
Figure 4B:
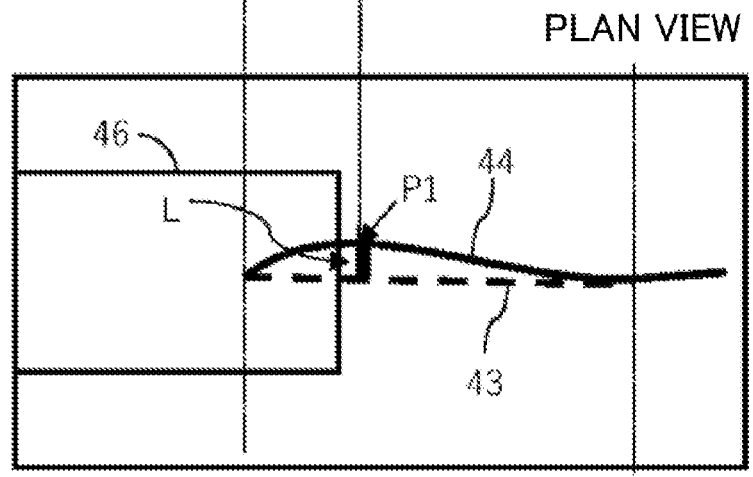

FIG. 4A and FIG. 4B are views for explaining a method of evaluating the leaning resistance in examples. As illustrated in FIG. 4A and FIG. 4B, the leaning resistance was evaluated based on a deviation due to an inclination of a loop bonding 44 bonded in each example from a straight line (a line indicating an ideal state with no leaning) 43 connecting bonding portions of a first bonding 41 and a second bonding 42, namely, a deviation width of a loop vertex P of the loop bonding 44 relative to the line 43 indicating the ideal state. Concretely, the loop bonding 44 is observed from right above the line 43 indicating the ideal state (above a plane of a semiconductor chip 46) with an optical microscope (a measuring microscope STM6 manufactured by Olympus Corporation). Subsequently, a distance (deviation width) L between a position P1 when the loop vertex P is projected from right above onto a plane same as that of the ideal straight line 43, and the ideal straight line 43, is measured. One hundred samples are observed, and an average value of the deviation widths L and standard deviations (σ) of the samples are determined. The standard deviation is determined by a root mean square sum of ((average value of deviation widths of 100 bonding wires)−(deviation width of each wire)). It is indicated that the smaller the standard deviation, the smaller the variation from the average value. The leaning resistance is represented by a value of "average value of deviation widths L+standard deviation of each wire". The wire having the value of less than 3 μm was judged as having extremely good leaning resistance (A), the wire having the value of 3 μm or more and less than 7 μm was judged as having good leaning resistance (B), and the wire having the value of 7 μm or more was judged as having defective leaning resistance (X). Note that the measurement of the deviation width may be performed by not only the optical microscope observation but also an image processing apparatus.

(Chip Damage)

A chip damage evaluation was conducted by performing ball bonding under the same conditions as above, and observing the substrate directly under the ball bonding portion with an optical microscope. One hundred ball bonding portions were observed, in which a case where no crack occurred at all in the substrate at all of the ball bonding portions was evaluated as extremely good (A), and a case where there were one or more small cracks that did not cause any particular problem in use was evaluated as good (B). Further, a case where there was even one large crack causing a problem in use was judged as defective (X).

(Production of Test Pieces for HAST and HTS)

Regarding the palladium-coated copper bonding wire obtained in each of the examples, the same fully automatic Cu wire bonder apparatus as above was used to perform wire bonding of 1000 wires on Al-1.0 mass % Si-0.5 mass % Cu alloy electrodes having a thickness of 2 μm on a 400-μm thick Si chip on a BGA (ball grid array) substrate under conditions same as the above-described conditions for the free air ball, the ball bonding, and the second bonding, respectively.

At this time, only bonding portions adjacent to each other of the Al-1.0 mass % Si-0.5 mass % Cu alloy electrodes on the chip were electrically connected, the two wires adjacent to each other electrically form one circuit, and 500 circuits in total were formed. Thereafter, the Si chip on the BGA substrate was encapsulated in resin by using a commercially-available transfer molding machine (GPGP-PRO-LAB80 manufactured by Dai-ichi Seiko Co., Ltd.) to obtain a test piece. Note that for the encapsulating resin, a commercially-available non-halogen-free resin was used.

<HAST (Highly Accelerated Temperature and Humidity Stress Test)>

This test piece was held by using a HAST device (PCR8D manufactured by HIRAYAMA Manufacturing Corporation) at 130° C.×85.0% RH (relative humidity) for 400 hours. Further, a test with severe specifications, in which the set temperature was increased by 5° C. and the test piece was held at 135° C.×85.0% RH (relative humidity) for 600 hours, was also performed on 500 circuits. Before and after the holding, electrical resistance values of the 500 circuits described above were measured for each time period. A case where in all the circuits, the electrical resistance values after the holding at 135° C. for 600 hours in severe specifications were less than 1.1 times the electrical resistance value before the holding was evaluated as extremely good (A), a case where there was a circuit having an electrical resistance increase rate of 1.1 or more in severe specifications but an electrical resistance increase rate after the holding at 130° C. for 600 hours in normal specifications was less than 1.1 was evaluated as very good (B), a case where there was a circuit having an electrical resistance increase rate of 1.1 or more after the holding for 600 hours in normal specifications, but an electrical resistance increase rate after the holding for 500 hours was less than 1.1 in the other circuits was evaluated as good (C), a case where there was a circuit having an electrical resistance increase rate after 500 hours in normal specifications of 1.1 or more, but an electrical resistance increase rate after 400 hours was less than 1.1 in the other circuits was evaluated as acceptable (D), and a case where there were one or more circuits having an electrical resistance increase rate after the holding for 400 hours of 1.1 or more was evaluated as defective (X) since high reliability was not guaranteed.

<HTS (High Temperature Storage Test)>

Further, the test piece produced under the same conditions as above was held by using a HTS device (DRS420DA manufactured by ADVANTEC CO., LTD.) at 220° C. for 2000 hours. Before and after the holding, electrical resistance values of the 500 circuits were measured similarly to the above, in which a case where in all the circuits, the resistance values after the holding were less than 1.1 times the resistance value before the holding was evaluated as extremely good (A), a case where not all the circuits had an electrical resistance increase rate of 1.2 or more and even one circuit had an electrical resistance increase rate of 1.1 or more and less than 1.2 was evaluated as good (B), and a case where even one circuit had an electrical resistance increase rate of 1.2 or more was evaluated as defective (X).

TABLE 1

Palladium-coated copper bonding wire (each value is value relative to entire wire)

| Example | | Derived from Pd layer | | | | Derived from core material | | |
|---|---|---|---|---|---|---|---|---|
| | | Pd (mass %) | S (massppm) | Se (massppm) | Te (massppm) | Sulfur group element (mass ppm) | Trace element (mass ppm) | Additive element (mass %) |
| Example | 1 | 1.1 | | | | | | |
| | 2 | 2.2 | | | | | | |
| | 3 | 3.9 | | | | | | |
| | 4 | 1.2 | 6 | | | | | |
| | 5 | 2.3 | 11 | | | | | |
| | 6 | 3.1 | | 7 | | | | |
| | 7 | 3.8 | | 19 | | Te 40 | | |
| | 8 | 1.5 | | | 18 | | | |
| | 9 | 2.8 | | | 48 | | | |
| | 10 | 2.0 | 10 | 10 | 25 | | | |
| | 11 | 1.8 | 10 | 15 | 28 | | | |
| | 12 | 3.3 | | 25 | | | | |
| | 13 | 3.6 | 8 | 8 | 20 | | | Pt 2.90% |
| | 14 | 1.3 | | | | Se 20 | | Pt 0.15% |
| | 15 | 2.1 | | | | | | Ni 0.11% |
| | 16 | 3.6 | | | | | | Pd 0.10% |
| | 17 | 1.4 | 5 | | | | P 100 ppm | Ga 0.13% |
| | 18 | 2.1 | | 13 | | | | In 0.05% |
| | 19 | 3.2 | | | 35 | | | Au 0.06% |
| | 20 | 1.9 | | | | | P 550 ppm | |
| | 21 | 2.1 | | | | | Fe 2 ppm | |
| | 22 | 3.3 | | | | | Ag 3 ppm | |
| | 23 | 3.5 | 7 | | 27 | | P 5 ppm | Rh 0.50% |
| | 24 | 1.3 | 9 | | | | Fe 80 ppm | |
| | 25 | 3.8 | | 6 | | | Ag 90 ppm | |
| | 26 | 3.6 | | | 40 | S 12 | P 450 ppm | |
| | 27 | 1.3 | 6 | | | | Tl 5 ppm | |
| | 28 | 2.4 | 11 | | | | | Rh 2.40% |
| | 29 | 3.0 | | 7 | | | | Ni 1.90% |
| | 30 | 1.1 | | 19 | | | | Pd 2.80% |
| | 31 | 1.6 | | | 18 | | | Ga 0.70% |
| | 32 | 2.9 | | | 48 | | | In 0.60% |
| | 33 | 3.4 | 8 | 8 | 20 | | Tl 75 ppm | Au 2.20% |
| Comparative example | 34 | 0.8 | | | | | | |
| | 35 | 4.2 | | 12 | | | | |
| | 36 | 2.3 | 10 | | | | | |

TABLE 2

| Example | | Property Work hardening coefficient | Crack in wire surface | Shrinkage cavity | Chip damage | Circularity | Leaning resistance | HAST | HTS |
|---|---|---|---|---|---|---|---|---|---|
| Example | 1 | 0.18 | A | A | A | B | A | D | D |
| | 2 | 0.14 | A | A | A | B | B | D | D |
| | 3 | 0.08 | A | A | A | B | A | D | D |
| | 4 | 0.15 | A | A | A | B | A | B | B |
| | 5 | 0.10 | A | A | A | B | B | B | B |
| | 6 | 0.11 | A | A | A | B | A | B | B |
| | 7 | 0.13 | A | A | A | B | A | B | B |
| | 8 | 0.14 | A | A | A | B | B | B | B |
| | 9 | 0.12 | A | A | A | B | A | B | B |
| | 10 | 0.17 | A | A | A | B | A | B | B |
| | 11 | 0.09 | B | A | A | B | A | B | B |
| | 12 | 0.16 | B | A | A | B | A | B | B |
| | 13 | 0.15 | A | A | B | B | A | B | B |
| | 14 | 0.08 | A | A | A | B | A | C | C |
| | 15 | 0.09 | A | A | A | B | A | C | C |
| | 16 | 0.08 | A | A | A | B | A | C | C |
| | 17 | 0.19 | A | A | B | A | A | A | A |
| | 18 | 0.17 | A | A | A | B | A | A | A |
| | 19 | 0.14 | A | A | A | B | A | A | A |
| | 20 | 0.13 | A | A | A | B | A | D | D |
| | 21 | 0.08 | A | A | A | A | A | D | D |
| | 22 | 0.11 | A | A | A | A | A | D | D |
| | 23 | 0.02 | A | A | A | A | A | A | A |
| | 24 | 0.04 | A | A | A | A | A | B | B |
| | 25 | 0.05 | A | A | A | A | A | B | B |
| | 26 | 0.09 | A | A | A | A | A | B | B |
| | 27 | 0.10 | A | A | A | A | A | B | B |
| | 28 | 0.08 | A | A | A | B | A | A | A |
| | 29 | 0.09 | A | A | A | B | A | A | A |
| | 30 | 0.08 | A | A | A | B | A | A | A |
| | 31 | 0.11 | A | A | A | B | A | A | A |
| | 32 | 0.08 | A | A | A | B | A | A | A |
| | 33 | 0.10 | A | A | A | A | A | A | A |
| Comparative example | 34 | 0.15 | A | A | A | B | A | X | X |
| | 35 | 0.14 | A | X | Not-evaluated | Not-evaluated | Not-evaluated | Not-evaluated | Not-evaluated |
| | 36 | 0.23 | A | A | A | B | X | Not-evaluated | Not-evaluated |

From the above Tables, according to the palladium-coated copper bonding wire having 1.0 to 4.0 mass % of the concentration of palladium in the entire wire, and having the work hardening coefficient in a range of the elongation rate 2% or more and the maximum elongation rate ε max % or less of 0.20 or less, the leaning resistance is good, and excellent reliability in the HAST and the HTS is provided.

For example, in the above-described device for automobile use, the biggest problem is the bonding life of the ball bonding portion (first bonding) where the free air ball and the electrode are bonded in particular. The device for automobile use is required to meet the condition that the resistance value of the semiconductor device, where the aluminum electrode and the ball are bonded to be resin-encapsulated, after the exposure for a long period of time in the HAST needs to be suppressed to an increase of 1.1 times or less the resistance value before the exposure. It is the halogen elements such as chlorine and the moisture, which are contained in the resin used for the encapsulation to be performed after ball bonding, that adversely affect the bonding life, namely, the increase in resistance value. These chlorine and moisture corrode the intermetallic compound generated in the ball bonding portion, causing the resistance value of the bonding portion to increase. The increase in resistance value causes poor current flow and interferes with the transmission of electrical signals, and in the case of automotive applications, the increase in resistance value may lead to automobile accidents, which becomes a serious problem. Further, in the palladium-coated copper bonding wires in the above-described examples, the leaning resistance is good, which remarkably reduces the short failure caused by a contact between wires (leaning, in particular) due to the narrowing of pitch between wires because of the increase in the number of bonding in one IC, and the results of the HAST test are all good even after 400-hour exposure, thus indicating that the bonding reliability is high and such a serious problem as above is not caused even when they are used for the devices for automobile use.

As shown in the above Table, the evaluations of the leaning resistance, the HAST, and the HTS regarding the palladium-coated copper bonding wire having the gold layer were good similarly to those of the palladium-coated copper bonding wire having no gold layer. It can be thought that this is because, unlike gold to adhere during the second bonding, gold derived from the gold layer covered, not locally, but uniformly the entire wire, which prevented the melting point from lowering locally, resulting in that no shrinkage cavity occurred.

What is claimed is:

1. A palladium-coated copper bonding wire, comprising: a core material containing copper as a main component; and a palladium layer on the core material,
   wherein a concentration of palladium relative to the entire wire is 1.0 mass % or more and 4.0 mass % or less, and a work hardening coefficient in a range of an elongation rate of 2% or more and a maximum elongation rate of ε max % or less, is 0.20 or less.

2. The palladium-coated copper bonding wire according to claim 1, wherein
the palladium-coated copper bonding wire contains at least one of sulfur group elements, and a total concentration of the sulfur group elements relative to the entire wire is 50 mass ppm or less in terms of concentration as a result of removing a concentration of a sulfur group element derived from the core material containing copper as the main component.

3. The palladium-coated copper bonding wire according to claim 1, wherein
the palladium-coated copper bonding wire contains at least one of sulfur group elements, and as a concentration obtained by removing a concentration of a sulfur group element derived from the core material containing copper as the main component from a concentration of the sulfur group elements relative to the entire wire, a concentration of sulfur is 5.0 mass ppm or more and 12.0 mass ppm or less, a concentration of selenium is 5.0 mass ppm or more and 20.0 mass ppm or less, or a concentration of tellurium is 15.0 mass ppm or more and 50.0 mass ppm or less.

4. The palladium-coated copper bonding wire according to claim 1, wherein
the palladium-coated copper bonding wire contains one or more of trace elements selected from the group consisting of Au, Pd, Pt, Rh, Ni, In, Ga, P, Ag, Fe, and Tl, of 1 mass ppm or more and 3 mass % or less in total relative to the entire wire.

5. The palladium-coated copper bonding wire according to claim 1, wherein
the palladium-coated copper bonding wire contains one or more of trace elements selected from the group consisting of Au, Pd, Pt, Rh, Ni, In, Ga, P, Ag, Fe, and Tl, in which when the palladium-coated copper bonding wire contains one or more selected from Au, Pd, Pt, Rh, and Ni, as the trace elements, a total content thereof is 0.05 mass % or more and 3 mass % or less relative to the entire wire, when the palladium-coated copper bonding wire contains one or more of In and Ga, as the trace elements, a total content thereof is 0.01 mass % or more and 0.7 mass % or less relative to the entire wire, when the palladium-coated copper bonding wire contains P, as the trace element, a content thereof is 5 mass ppm or more and 500 mass ppm or less relative to the entire wire, and when the palladium-coated copper bonding wire contains one or more of Ag, Fe, and Tl, as the trace elements, a total content thereof is 1 mass ppm or more and 100 mass ppm or less relative to the entire wire.

6. The palladium-coated copper bonding wire according to claim 1, wherein
a concentration of palladium derived from the palladium layer is 1.0 mass % or more and 2.5 mass % or less relative to the entire palladium-coated copper boning wire.

7. The palladium-coated copper bonding wire according to claim 1, further comprising a gold layer on the palladium layer.

8. The palladium-coated copper bonding wire according to claim 1, wherein
a diameter of the palladium-coated copper bonding wire is 10 μm or more and 25 μm or less.

9. A manufacturing method of a palladium-coated copper bonding wire including: a core material containing copper as a main component; and a palladium layer on the core material, having a concentration of palladium relative to the entire wire of 1.0 to 4.0 mass %, and having a work hardening coefficient in a range of an elongation rate of 2% or more and a maximum elongation rate of ε max % or less, of 0.20 or less.

10. The manufacturing method according to claim 9, comprising:
preparing a copper wire rod containing copper as a main component, and forming a palladium layer on a surface of the copper wire rod;
performing drawing on the copper wire rod having the palladium layer formed thereon; and
performing intermediate heat treatment at a working ratio from the completion of the formation of the palladium layer of 60% or more and 90% or less.

11. The manufacturing method according to claim 9, comprising:
preparing a copper wire rod containing copper as a main component, and containing one or more of trace elements selected from Au, Pd, Pt, Rh, Ni, In, Ga, P, Ag, Fe, and Tl, of 1 mass ppm or more and 3 mass % or less in total relative to the entire wire, and forming a palladium layer on a surface of the copper wire rod; and
performing drawing on the copper wire rod having the palladium layer formed thereon.

12. A semiconductor device, comprising:
a semiconductor chip;
an aluminum-containing aluminum electrode provided on the semiconductor chip;
a gold or silver-coated external electrode provided outside the semiconductor chip; and
the palladium-coated copper bonding wire according to claim 1 connecting the aluminum electrode and a surface of the external electrode.

13. The semiconductor device according to claim 12, wherein
the semiconductor device forms QFP (Quad Flat Packaging), BGA (Ball Grid Array), or QFN (Quad For Non-Lead Packaging).

14. The semiconductor device according to claim 12, wherein
the semiconductor device is for automobile use.

15. A manufacturing method of a semiconductor device including: a semiconductor chip; an aluminum-containing aluminum electrode provided on the semiconductor chip; a gold or silver-coated external electrode provided outside the semiconductor chip; and a bonding wire connecting the aluminum electrode and a surface of the external electrode, the manufacturing method comprising:
preparing a palladium-coated copper bonding wire including: a core material containing copper as a main component; and a palladium layer on the core material, having a concentration of palladium relative to the entire wire of 1.0 mass % or more and 4.0 mass % or less, and having a work hardening coefficient in a range of an elongation rate of 2% or more and a maximum elongation rate ε max % or less, of 0.20 or less;
forming a free air ball at a tip of the palladium-coated copper bonding wire;
making the palladium-coated copper bonding wire to be subjected to ball bonding to the aluminum electrode via the free air ball; and then making a portion of the palladium-coated copper bonding wire apart from the free air ball by a length of the bonding wire to be subjected to second bonding to the surface of the external electrode.

* * * * *